(12) United States Patent
Du et al.

(10) Patent No.: US 11,711,956 B2
(45) Date of Patent: Jul. 25, 2023

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Hongjun Zhou, Beijing (CN); Bo Wei, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 109 days.

(21) Appl. No.: 17/419,709

(22) PCT Filed: Sep. 29, 2020

(86) PCT No.: PCT/CN2020/119095
§ 371 (c)(1),
(2) Date: Jun. 29, 2021

(87) PCT Pub. No.: WO2022/067584
PCT Pub. Date: Apr. 7, 2022

(65) Prior Publication Data
US 2022/0320229 A1 Oct. 6, 2022

(51) Int. Cl.
*H10K 59/131* (2023.01)
*G09G 3/00* (2006.01)
*G09G 3/3225* (2016.01)

(52) U.S. Cl.
CPC .......... *H10K 59/131* (2023.02); *G09G 3/006* (2013.01); *G09G 3/3225* (2013.01);
(Continued)

(58) Field of Classification Search
CPC ... G09G 3/3225; G09G 3/006; H01L 27/3276
See application file for complete search history.

(56) References Cited

U.S. PATENT DOCUMENTS 10,325,559 B2 * 6/2019 Lee ........................... G09G 3/20
10,991,315 B2 * 4/2021 Li .......................... G09G 3/3225
(Continued)

FOREIGN PATENT DOCUMENTS

| CN | 107024788 A | 8/2017 |
| CN | 107611142 A | 1/2018 |

(Continued)

*Primary Examiner* — Sardis F Azongha
(74) *Attorney, Agent, or Firm* — Ling Wu; Stephen Yang; Ling and Yang Intellectual Property

(57) ABSTRACT

A display substrate and a display apparatus are disclosed. The display substrate includes a display region and a peripheral region, the peripheral region includes a circuit region, and the display region includes a plurality of sub-pixels, a plurality of data lines extending along a first direction and a plurality of gate lines extending along a second direction crossing the first direction. The circuit region includes a plurality of driving unit groups. The circuit region includes a first sub-region and a second sub-region that are opposite to each other at two sides of the display region along the first direction, the first sub-region includes a plurality of multiplexing unit groups and the second sub-region includes a plurality of test unit groups.

19 Claims, 13 Drawing Sheets

(52) U.S. Cl.
CPC ............... *G09G 2300/0426* (2013.01); *G09G 2300/0842* (2013.01); *G09G 2310/0202* (2013.01); *G09G 2310/0281* (2013.01); *G09G 2330/04* (2013.01); *G09G 2330/12* (2013.01)

(56) References Cited

U.S. PATENT DOCUMENTS

| | | |
|---|---|---|
| 11,393,893 B2 * | 7/2022 | Jo ..................... G09G 3/3233 |
| 2016/0055789 A1 | 2/2016 | Hashimoto |
| 2016/0181280 A1 | 6/2016 | Lou et al. |
| 2017/0221434 A1 | 8/2017 | Shima |
| 2018/0129106 A1 | 5/2018 | Gao et al. |
| 2019/0088191 A1 | 3/2019 | Shin et al. |
| 2019/0114025 A1 | 4/2019 | Wei |

FOREIGN PATENT DOCUMENTS

| | | |
|---|---|---|
| CN | 107783696 A | 3/2018 |
| CN | 110265468 A | 9/2019 |
| CN | 111104005 A | 5/2020 |
| CN | 111599847 A | 8/2020 |
| KR | 10-2016-0022765 A | 3/2016 |

\* cited by examiner

DISPLAY SUBSTRATE AND DISPLAY APPARATUS

TECHNICAL FIELD

Embodiments of the present disclosure relate to, but are not limited to, the technical field of display, in particular to a display substrate and a display apparatus.

BACKGROUND

Organic Light Emitting Diode (OLED) display technology has been widely used in TV, smart phone, wearable display device, virtual reality (VR) display, automobile display and other fields due to its advantages of lightness and thinness, flexibility, excellent shock resistance and fast response speed.

With the development of technology, large "Screen-to-Body Ratio (that is, a ratio of an area of an actual display region to a total area of a display side)" has become one of the appearance characteristics pursued by display devices. Especially, for wearable display devices (for example, smart watches), based on the consideration such as portability and viewing angle effect, extremely narrow bezel or even full screen display has become an important trend in development.

In some related technologies, some circuits for driving sub-pixels can be directly disposed outside a display region of a display substrate. Obviously, a region where the driving circuit is located cannot display directly, so it corresponds to the "bezel" of the display device.

SUMMARY

The following is a summary of subject matter described in detail herein. This summary is not intended to limit the protection scope of the claims.

An embodiment of the present disclosure provides a display substrate including a display region and a peripheral region, wherein the peripheral region includes a circuit region, and the display region includes a plurality of sub-pixels, a plurality of data lines extending along a first direction and a plurality of gate lines extending along a second direction crossing the first direction, each of the data lines is connected with the plurality of sub-pixels and each of the gate lines is connected with the plurality of sub-pixels;

the circuit region includes a first sub-region and a second sub-region that are opposite to each other at two sides of the display region along the first direction, the circuit region includes a plurality of driving unit groups each including at least one driving unit, the first sub-region includes a plurality of multiplexing unit groups each including at least one multiplexing unit, and the second sub-region includes a plurality of test unit groups each including at least one test unit, the driving unit is configured to provide a driving signal to the gate lines, the multiplexing unit is configured to provide a data signal to the data lines, and the test unit is configured to provide a test signal to the data lines; and in the first sub-region, the driving unit groups and multiplexing unit groups are alternately disposed; and in the second sub-region, the driving unit groups and the test unit groups are alternately disposed.

In an exemplary embodiment, the circuit region further includes a connection sub-region located between the first sub-region and the second sub-region, and the connection sub-region is configured to electrically connect the first sub-region and the second sub-region; and the circuit region also includes a signal line protection unit which is located at a side of the connection sub-region away from the display region and is electrically connected with signal lines of the circuit region.

In an exemplary embodiment, the signal line protection unit includes at least one polysilicon resistor, and the circuit region further includes a plurality of signal lines, and each of the at least one polysilicon resistor is connected between at least two of the signal lines.

In an exemplary embodiment, the signal lines include a test signal line connected with the test unit and a driving signal line connected with the driving unit, wherein the driving signal line includes a high level line and a low level line, and the test signal line includes a test control line and a test data line, and the at least one polysilicon resistor connects the test control line and the high level line.

In an exemplary embodiment, the signal lines include a multiplexing signal line connected with the multiplexing unit and a test signal line connected with the test unit, wherein the test signal line includes a test control line and a test data line, and the at least one polysilicon resistor connects the test control line and the multiplexing control line.

In an exemplary embodiment, the signal line protection unit includes at least one electrostatic discharge unit, and the signal lines include a multiplexing signal line connected with the multiplexing unit, a test signal line connected with the test unit and a driving signal line connected with the driving unit, and each of the at least one electrostatic discharge unit is connected with one of the signal lines.

In an exemplary embodiment, the driving signal line includes a high level line and a low level line, the test signal line includes a test control line and a test data line, and the multiplexing signal line includes a multiplexing control line and a multiplexing data line, and the at least one electrostatic discharge unit is connected with the test control line, or the at least one electrostatic discharge unit is connected with the test data line, or the at least one electrostatic discharge unit is connected with the multiplexing control line.

In an exemplary embodiment, in the first sub-region, the number C of multiplexing units included in the multiplexing unit groups between two adjacent driving unit groups and a gap size D between the two adjacent driving unit groups satisfy a following relationship: $D=a*C+(C+1)*d1$; wherein, a is a size of each multiplexing unit along an arrangement direction of the multiplexing units and d1 is a gap size between the adjacent multiplexing units; and/or, in the second sub-region, the number E of test units included in the test unit groups between two adjacent driving unit groups and a gap size F between two adjacent driving unit groups satisfy a following relationship: $F=b*E+(E+1)*d2$; wherein b is a size of each test unit along an arrangement direction of the test unit, and d2 is a gap size between the adjacent test units.

In an exemplary embodiment, d1 is 1 to 5 microns and d2 is 1 to 5 microns.

In an exemplary embodiment, the first sub-region includes a first circular arc region and the second sub-region includes a second circular arc region; in the first sub-region, the driving unit groups and multiplexing unit groups are alternately disposed, specifically, in the first circular arc region, the driving unit groups and multiplexing unit groups are alternately disposed along a edge of the first circular arc region close to the display region; and in the second sub-region, the driving unit groups and the test unit groups are alternately disposed, specifically, in the second circular arc region, the driving unit groups and the test unit groups are alternately disposed along a edge of the second circular arc region close to the display region.

In an exemplary embodiment, in the first circular arc region, a connection track of center points of coverage regions of the plurality of driving unit groups is a first circular arc track, and a connection track of center points of coverage regions of the plurality of multiplexing unit groups is a second circular arc track, and a circle center corresponding to the first circular arc track, a circle center corresponding to the second circular arc track are substantially coincide with a circle center corresponding to an edge of the first circular arc region close to the display region; and/or in the second circular arc region, a connection track of center points of coverage regions of the plurality of driving unit groups is a third circular arc track, and a connection track of center points of coverage regions of a plurality of test unit groups is a fourth circular arc track, and a circle center corresponding to the third circular arc track, a circle center corresponding to the fourth circular arc track are substantially coincide with a circle center corresponding to an edge of the second circular arc region close to the display region.

In an exemplary embodiment, the first circular arc region is a semi-circle shape, and the second circular arc region is a semi-circle shape.

In an exemplary embodiment, the first sub-region includes a first U-shaped annulus region and the second sub-region includes a second U-shaped annulus region, the first U-shaped annulus region includes two sections of the first circular arc region and at least one section of a second rectangular region, and the second U-shaped annulus region includes two sections of the second circular arc region and at least one section of a third rectangular region; in the second rectangular region, the plurality of the multiplexing units are disposed along a side of the second rectangular region close to the display region; and in the third rectangular region, the plurality of the test units are disposed along a side of the third rectangular region close to the display region.

In an exemplary embodiment, the circuit region further includes a plurality of sections of the first rectangular region, and the first rectangular region are disposed between the first circular arc region and the second circular arc region; and in the first rectangular region, the plurality of the driving units are disposed along a side of the first rectangular region close to the display region.

In an exemplary embodiment, in the first sub-region, the multiplexing unit groups include a first multiplexing unit group and a second multiplexing unit group, the first multiplexing unit group includes M multiplexing units, and the second multiplexing unit group includes N multiplexing units, where N and M are integers greater than 1 and M<N, the second multiplexing unit group is located in the middle of the first sub-region and the first multiplexing unit group is located at two ends of the first sub-region away from the middle of the first sub-region; and/or in the second sub-region, the test unit groups include a first test unit group and a second test unit group, the first test unit group includes K test units, and the second test unit group includes L test units, where L and K are integers greater than 1, and K<L, the second test unit group is located in the middle of the second sub-region, and the first test unit group is located at two ends of the second sub-region away from the middle of the second sub-region.

In an exemplary embodiment, the peripheral region further includes a joint region located at a side of the first sub-region away from the display region, the joint region includes a plurality of joints, and at least some of the joints are connected with signal lines; the signal lines include a multiplexing signal line connected with the multiplexing unit, a test signal line connected with the test unit, and a driving signal line connected with the driving unit.

In an exemplary embodiment, the peripheral region further includes a fan-out region disposed between the joint region and the first sub-region, and the fan-out region includes a plurality of multiplexing signal lines.

In an exemplary embodiment, the multiplexing signal line includes a plurality of multiplexing control lines and a plurality of multiplexing data lines; at least one of the multiplexing units includes a plurality of multiplexing transistors, each of which has a gate connected with one of the multiplexing control lines, a first electrode connected with one of the data lines, and a second electrode connected with one of the multiplexing data lines; and second electrodes of all multiplexing transistors of the same multiplexing unit are connected with the same multiplexing data line, and second electrodes of multiplexing transistors of different multiplexing units are connected with different multiplexing data lines.

In an exemplary embodiment, the test signal line includes test control lines and test data lines; at least one of the test units includes a plurality of test transistors, each of which has a gate connected with one of test control lines, a first electrode connected with one of the data lines, and a second electrode connected with one of the test data lines; and each of the test data lines is connected with a plurality of test units.

An embodiment of the present disclosure also provides a display apparatus including the display substrate of any one of the above embodiments.

Other aspects will become apparent upon reading and understanding the brief description of the drawings and embodiments of the present disclosure.

BRIEF DESCRIPTION OF DRAWINGS

The attached drawings are used to provide a further understanding of the technical scheme of the present disclosure, and constitute a part of the specification. They are used together with the embodiments of the present application to explain the technical scheme of the present disclosure, and do not constitute a restriction on the technical scheme of the present disclosure. The above and other features and advantages will become more apparent to those skilled in the art by describing detailed example embodiments with reference to the accompanying drawings, in which.

Figure 1:
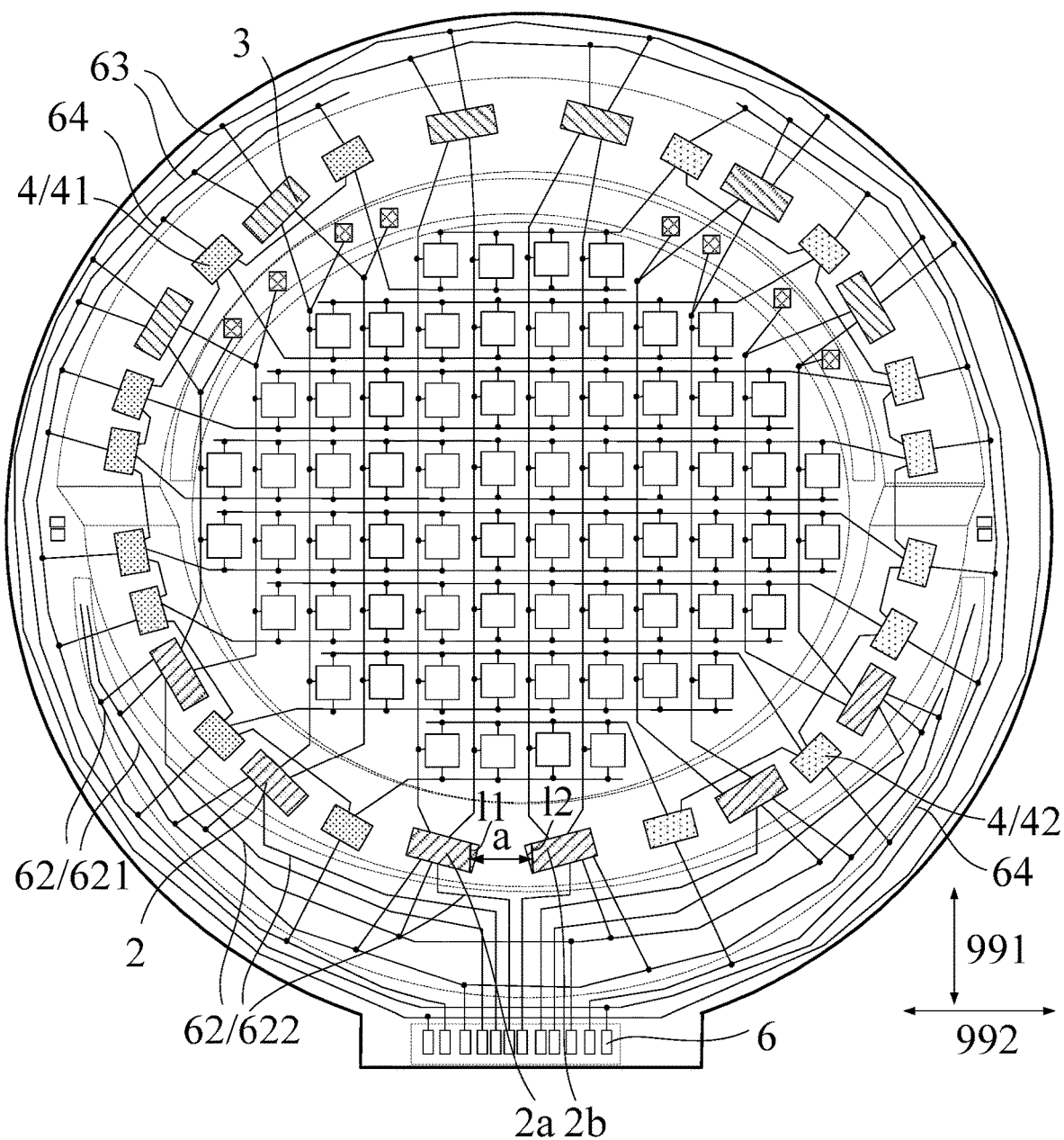
FIG. 1 is a schematic diagram of a structure of a display substrate according to an embodiment of the present disclosure.

In the drawings of the embodiments of the present disclosure, the meanings of the reference numerals are as follows:

1 sub-pixel, 11 data line, 12 gate line, 13 control electrode line, 19 anode signal line;

2 multiplexing unit, 21 multiplexing transistor;

3 test unit, 31 test transistor, 311 first test transistor, 312 second test transistor, 313 third test transistor, 314 fourth test transistor, 315 fifth test transistor;

4 driving unit, 41 gate driving unit, 42 control electrode driving unit;

5 compensation capacitor unit, 51 compensation capacitor;

6 joint, 62 multiplexing signal line, 621 multiplexing control line, 622 multiplexing data line, 63 test signal line, 631 test control line, 6311 first test control line, 6312 second test control line, 6313 third test control line, 632 test data line, 6321 first test data line, 6322 second test data line, 6323 third test data line;

64 driving signal line, 641 high level line, 642 low level line;

71 polysilicon resistor, 711 first polysilicon resistor, 712 second polysilicon resistor, 72 electrostatic discharge unit, 721 first discharge transistor, 722 second discharge transistor;

91 display region, 92 circuit region, 921 first sub-region, 922 second sub-region, 923 connection sub-region, 93 fan-out region, 94 joint region, 95 capacitor region; 991 first direction, 992 second direction;

T1 first transistor, T2 second transistor, T3 third transistor, T4 fourth transistor, T5 fifth transistor, T6 sixth transistor, T7 seventh transistor, Cst storage capacitor, Reset first reset terminal, Reset' second reset terminal, Vinit initialization terminal, Gate gate line terminal, Data data line terminal, EM control electrode terminal, VDD anode signal terminal, VSS cathode signal terminal;

K1 first gate transistor, K2 second gate transistor, K3 third gate transistor, K4 fourth gate transistor, K5 fifth gate transistor, K6 sixth gate transistor, K7 seventh gate transistor, K8 eighth gate transistor, C1 first gate capacitor, C2 second gate capacitor, N1 first gate node, N2 second gate node, N3 third gate node;

M1 first control electrode transistor, M2 second control electrode transistor, M3 third control electrode transistor, M4 fourth control electrode transistor, M5 fifth control electrode transistor, M6 sixth control electrode transistor, M7 seventh control electrode transistor, M8 eighth control electrode transistor, M9 ninth control electrode transistor, M10 tenth control electrode transistor, C1' first control electrode capacitor, C2' second control electrode capacitor, C3' third control electrode capacitor, N1' first control electrode node, N2' second control electrode node, N3' third control electrode node, N4' fourth control electrode node.

DETAILED DESCRIPTION

In order to enable the technical personnel in the field to better understand the technical scheme of the embodiments of the present disclosure, a display substrate and a display apparatus provided by the embodiments of the present disclosure are described below with reference to the drawings.

Embodiment of that present disclosure will be described more fully hereinafter with reference to the accompany drawings, but the illustrated embodiments may be embodied in different forms and should not be construed as limited to the embodiments set forth in the present disclosure. On the contrary, these examples are provided for the purpose of making the present disclosure thorough and complete, and will enable those skilled in the art to fully understand the scope of the present disclosure.

Embodiments of present disclosure may be described with reference to a plan view and/or a cross-sectional view by mean of an ideal schematic diagram of the present disclosure. Therefore, example illustrations may be modified according to manufacturing techniques and/or tolerances.

The embodiments of the present disclosure and the features in the embodiments can be combined with each other if there is no conflict.

Terms used in the present disclosure are only used to describe specific embodiments and are not intended to limit the present disclosure. As used in the present disclosure, the term "and/or" includes any and all combinations of one or more related enumerated items. As used in the present disclosure, the singular forms "a" and "the" are also intended to include the plural forms, unless the context clearly indicates otherwise. As used in the present disclosure, the terms "including" and "made of" specify the presence of stated features, integers, steps, operations, elements and/or components, but do not exclude the presence or addition of one or more other features, integers, steps, operations, elements, components and/or groups thereof.

Unless otherwise defined, all terms (including technical and scientific terms) used in the present disclosure have the same meanings as those commonly understood by those of ordinary skill in the art. It will also be understood that terms such as those defined in commonly used dictionaries should be interpreted as having meanings consistent with their meanings in the context of the related art and the present disclosure, and will not be interpreted as having idealized or excessive formal meanings unless the present disclosure explicitly defines so.

Embodiments of the present disclosure are not limited to the embodiment shown in the drawings, but include modifications of configurations for based on manufacturing processes. Therefore, the regions illustrated in the drawings have schematic properties, and the shapes of the regions shown in the drawings illustrate the specific shapes of the regions of the elements, but are not intended to be limiting.

In the drawings, sizes of constituent elements and thicknesses and regions of layers are sometimes exaggerated for clarity. Therefore, an implementation of the present disclosure is not necessarily limited to the sizes shown. The shapes and sizes of components in the drawings do not reflect true proportions. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation.

In the present disclosure, for the sake of convenience, wordings such as "central", "upper", "lower", "front", "rear", "vertical", "horizontal", "top", "bottom", "inner", "outer" and the others describing the orientations or positional relations are used to depict the relationship of constituent elements with reference to the drawings, which are only for an easy and simplified description of the present disclosure, rather than for indicating or implying that the device or element referred to must have a specific orientation, or must be constructed and operated in a particular orientation and therefore, those wordings cannot be construed as limitations on the present disclosure. The positional relations of the constituent elements are appropriately changed according to the direction in which each constituent element is described. Therefore, they are not limited to the wordings in the specification, and may be replaced appropriately according to the situations.

In the description of the embodiments of the present disclosure, the terms "installed", "connected" and "coupled" shall be broadly understood unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. For those of ordinary skills in the art, the specific meanings of the above terms in the present disclosure may be understood according to specific situations.

In the present disclosure, a transistor refers to an element including at least three terminals, namely, a gate electrode, a drain electrode and a source electrode. The transistor has a channel region between the drain electrode (also referred to as a drain terminal, a drain region or a drain electrode) and the source electrode (also referred to as a source terminal, a source region or a source electrode), and current can flow through the drain electrode, the channel region and the source electrode. It should be noted that in this specification, the channel region refers to a region through which current mainly flows.

In the present disclosure, a first electrode may be a drain electrode while a second electrode may be a source electrode, or a first electrode may be a source electrode while a second electrode may be a drain electrode. The functions of the "source electrode" and that of the "drain electrode" are interchangeable under circumstances where transistors with opposite polarities are used or where the current direction changes during circuit operation. Therefore, in this specification, "source electrode" and "drain electrode" are interchangeable.

In the present disclosure, "an electrical connection" includes a case where constituent elements are connected via an element having a certain electrical function. The "element having a certain electrical action" is not particularly limited as long as it can transmit and receive electrical signals between connected constituent elements. Examples of the "elements having certain electrical function" include not only electrodes and wiring, but also switching elements such as transistors, resistors, inductors, capacitors, and other elements having various functions.

In the present disclosure, "parallel" refers to a state in which two straight lines form an angle between −10 degrees and 10 degrees and thus, includes a state in which the angle is between −5 degrees and 5 degrees. In addition, "vertical" refers to a state in which two straight lines form an angle between 80 degrees and 100 degrees and thus, includes a state in which the angle is between 85 and 95 degrees.

In the embodiments of the present disclosure, "film" and "layer" can be interchanged. For example, sometimes "conductive layer" may be replaced by "conductive film". Similarly, "insulating film" may sometimes be replaced by "insulating layer".

In the present specification, "about" means that there is not strict limit for a value, and values within an error range during processes and measurement are allowed.

In a first aspect, referring to FIG. 1 to FIG. 2 and FIG. 4 to FIG. 5, embodiments of the present disclosure provide a display substrate.

A display substrate according to an embodiment of the present disclosure is a substrate used in a display apparatus, for example, an array substrate provided with a thin film transistor (TFT) array.

A display substrate according to an embodiment of the present disclosure includes a display region 91 and a peripheral region surrounding the display region 91, wherein the peripheral region includes a capacitor region 95, a circuit region 92, a fan-out region 93 and a joint region 94.

The display region 91 includes: a plurality of sub-pixels 1; a plurality of data lines 11 extending along a first direction 991, each of the data lines 11 is connected with a plurality of sub-pixels 1; and a plurality of gate lines 12 extending along a second direction 992 crossing the first direction 991, each of the gate lines 12 is connected a plurality of sub-pixels 1.

The circuit region 92 surrounds the display region 91, and the circuit region 92 includes a first sub-region 921 and a second sub-region 922 opposite to each other at two sides of the display region 91 along the first direction 991. The first sub-region 921 includes a plurality of multiplexing unit groups configured to provide data signals to the plurality of data lines 11, and the multiplexing unit groups include at least one multiplexing unit 2. The second sub-region 922 includes a plurality of test unit groups configured to provide test signals to the plurality of data lines 11, and the test unit groups includes at least one test unit 3. The circuit region 92 also includes a plurality of driving unit groups including at least one driving unit 4. In the first sub-region 921, the driving unit groups and the multiplexing unit groups are alternately disposed along a circumferential direction, and in second sub-region 922, the driving unit groups and the test unit groups are alternately disposed along the circumferential direction.

The capacitor region 95 is located between the second sub-region 922 and the display region 91, and includes a plurality of compensation capacitor units 5, each of which is connected with a data line 11.

The joint region 94 is located at a side of the first sub-region 921 away from the display region 91, and includes a plurality of joints 6, at least some of which are connected with signal lines. The signal lines include a multiplexing signal line 62 connected with the multiplexing unit 2, a testing signal line 63 connected with the testing unit 3, and a driving signal line 64 connected with the driving unit 4.

The fan-out region 93 is located between the joint region 94 and the first sub-region 921, and the fan-out region 93 includes a plurality of multiplexing signal lines 62.

Referring to FIG. 1, FIG. 2, FIG. 4 and FIG. 5, the display substrate according to the embodiment of the present disclosure is divided into a plurality of regions, and a display region 91 (or AA region) for displaying is located in the middle, and sub-pixels 1 (or referred to as sub pixel) for displaying are arranged in the display region 91.

A sub-pixel 1 refers to the smallest structure that may be used to independently display the required content, that is, the smallest "point" that may be independently controlled in the display apparatus.

A specific form of the sub-pixel 1 may be various as long as it can achieve independent display.

Figure 3:
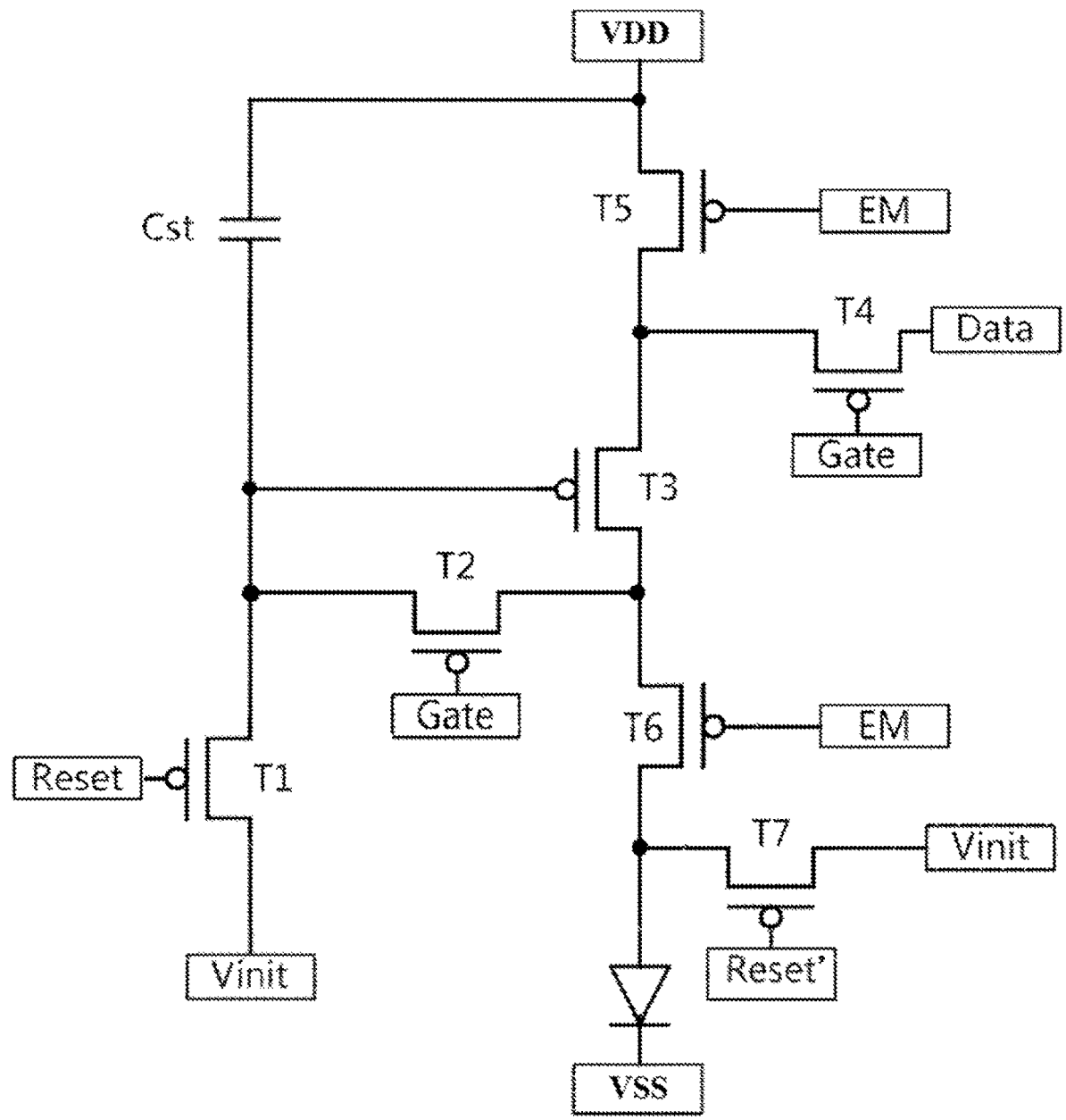
FIG. 3 is a schematic diagram of a circuit of a pixel circuit in a display substrate according to an embodiment of the present disclosure.

Exemplarily, the sub-pixel 1 may include a pixel circuit that may emit light with a desired brightness under control of a corresponding gate line 12, a data line 11, and the like. For example, the pixel circuit may have a 7T1C structure (that is, including 7 transistors and 1 capacitor). Referring to FIG. 3, a pixel circuit of the above 7T1C structure may include structures such as a first transistor T1, a second transistor T2, a third transistor T3, a fourth transistor T4, a fifth transistor T5, a sixth transistor T6, a seventh transistor T7, a storage capacitor Cst, an organic light emitting diode OLED, a first reset terminal Reset, a second reset terminal Reset', an initialization terminal Vinit, a gate line terminal Gate, a data line terminal Data, a control terminal EM, an anode signal terminal VDD and a cathode signal terminal VSS, etc. Each transistor can be a P-type transistor (for example, PMOS). The data line terminal (Data) may be connected with the data line 11, the gate line terminal (Gate) may be connected with the gate line 12, the control electrode line terminal (EM) may be connected with a control electrode line 13, the first reset terminal (Reset) and the second reset terminal (Reset') may be connected with the gate line of a previous row at the same time, the second reset terminal Reset' may also be connected with the gate line of a current row, and other terminals may also be connected with corresponding signal sources.

That is, in each sub-pixel 1 of the display substrate according to the embodiment of the present disclosure, an organic light emitting diode OLED may be used as a light emitting device, which is specifically an organic light emitting diode display substrate or an array substrate provided with a thin film transistor (TFT) array.

Among them, different sub-pixels 1 may have different colors, so that color display may be achieved by the mixed light of different sub-pixels 1. When color display is to be achieved, a pixel (or pixel unit) is formed by a plurality of sub-pixels 1 of different colors arranged together, that is, the light emitted by these sub-pixels 1 is mixed together to become a visual "point." For example, three sub-pixels 1, which may be red, green and blue, form one pixel. Or, there may be no explicit pixel (or pixel unit), and the color display may be achieved by "sharing" between adjacent sub-pixels 1.

Referring to FIG. 1, FIG. 2, FIG. 4, and FIG. 5, the data lines 11 extending along the first direction 991 and the gate lines 12 extending along the second direction 992 are further disposed in the display region 91, wherein the first direction 991 intersects with the second direction 992 (i.e., they are not parallel to each other), so that each intersection of the data lines 11 and the gate lines 12 can define a sub-pixel 1, the sub-pixel 1 at the intersection of a gate line 12 and a data line 11 can be displayed under combined control of the gate line 12 and the data line 11.

In some embodiments, the first direction 991 is perpendicular to the second direction 992, that is, the first direction 991 may be a column direction (a longitudinal direction in FIG. 1, FIG. 2, FIG. 4, and FIG. 5), and the second direction 992 may be a row direction perpendicular to the column direction (a transverse direction in FIG. 1, FIG. 2, FIG. 4, and FIG. 5).

It should be understood that the first direction 991 and the second direction 992 are actually only two opposite directions corresponding to the data lines 11 and the gate lines 12, which are not necessarily the column direction or the row direction, and have no necessary relationship with a shape, a location and a placement mode of the display substrate (or display apparatus).

In some embodiments, the sub-pixels 1 in the display region 91 may be arranged in an array, that is, the sub-pixels 1 may be arranged in multiple rows and multiple columns, wherein each row of sub-pixels 1 is connected with a gate line 12 and each column of sub-pixels 1 is connected with a data line 11.

It should be understood that the sub-pixels 1 are not necessarily arranged in an array, and each data line 11 and each gate line 12 are not necessarily connected with the sub-pixels 1 in the same column and in the same row.

Referring to FIG. 1, FIG. 2, FIG. 4 and FIG. 5, a region outside the display region 91 is the circuit region 92 surrounding the display region 91, so the whole display region 91 is annulus shape. Because the peripheral region is not for display, it corresponds to the "bezel" of the display apparatus.

Figure 2:
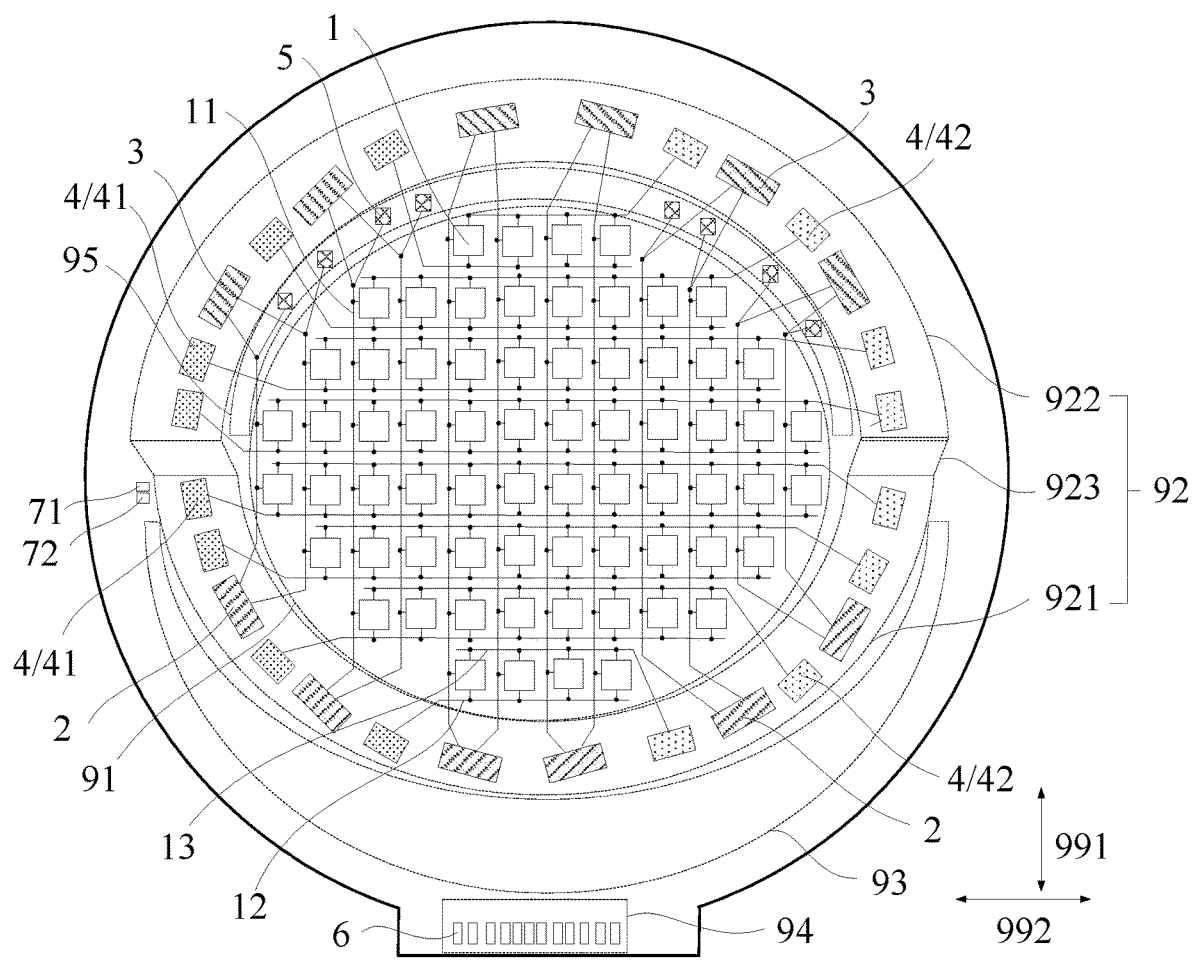
FIG. 2 is a schematic diagram of a structure of a display substrate according to an embodiment of the present disclosure (some leads are not shown)

The peripheral region includes a circuit region 92 surrounding the display region 91, so the whole circuit region 92 is also annulus shape, which includes a first sub-region 921 and a second sub-region 922 which are oppositely disposed at two sides of the display region 91 along the first direction 991, such as "a lower half region" and "an upper half region" in FIG. 1 and FIG. 2. The first sub-region 921 includes a plurality of multiplexing units 2 (MUXs), and each multiplexing unit 2 is connected with the data line 11 from one side (a lower side in FIG. 1, FIG. 2, FIG. 4, and FIG. 5) for providing a data signal (data voltage) to the data line 11 during display. While the second sub-region 922 includes a plurality of test units 3 (CTs), and each test unit 3 is connected with the data line 11 from the other side (an upper side in FIG. 1, FIG. 2, FIG. 4, and FIG. 5) for providing a test signal to the data line 11 in a test phase to detect whether the display substrate is defective.

In addition, a plurality of driving units 4 is disposed in the circuit region 92 for providing other driving signals.

In some embodiments, at least some of the driving units 4 are configured to provide driving signals to the gate lines 12, that is, at least some of the driving units 4 are connected with the above gate lines 12 and used to provide signals to the gate lines 12 to control the operation of the sub-pixels 1 connected with the corresponding gate lines 12.

It can be seen that the above multiplexing units 2 form a plurality of "multiplexing unit groups", and each multiplexing unit group includes a multiplexing unit 2 or a plurality of multiplexing units 2 arranged continuously. The test units 3 form a plurality of "test unit groups", and each test unit group includes a test unit 3 or a plurality of test units 3 arranged continuously. The driving units 4 form a plurality of "driving unit groups", and each driving unit group includes a driving unit 4 or a plurality of driving units 4 arranged continuously. Therefore, there are different units in the circuit region 92, and these units are "arranged in a mixed manner".

Specifically, referring to FIG. 1, FIG. 2, FIG. 4, FIG. 5, FIG. 14 and FIG. 15, in the first sub-region 921, the driving unit groups and the multiplexing unit groups are alternately disposed along a "circumferential direction."

Among them, the "circumferential direction" refers to a direction of rotating around a center of a planar graphic, or a direction of circling an edge of the graphic in a clockwise or counterclockwise direction.

That is, in the embodiment of the present disclosure, when the circuit region 92 which is basically annulus shape is traversed in a clockwise or counterclockwise manner, in the first sub-region 921, the driving unit groups and the multiplexing unit groups appear alternately, that is, one driving unit group-one multiplexing unit group-one driving unit group-one multiplexing unit group appears, and so on. Of course, each "group" includes one or more continuous corresponding units, so that the driving units 4 and the multiplexing units 2 in the first sub-region 921 are "arranged in a mixed manner (but a plurality of units of each type may be continuously arranged together)" instead of being concentrated in different positions of the first sub-region 921.

Specifically, in FIG. 1, FIG. 2, FIG. 4, FIG. 5, FIG. 14, and FIG. 15, in the second sub-region 922, the driving unit groups and the test unit groups are alternately disposed along the circumferential direction.

That is, when the circuit region 92 which is basically annulus shape is traversed in a clockwise or counterclockwise manner, in the second sub-region 922, driving unit groups and test unit groups appear alternately, that is, one driving unit group-one test unit group-one driving unit group-one test unit group appears, and so on. Of course, each "group" includes one or more continuous corresponding units, so that the driving units 4 and the testing units 3 in the second sub-region 922 are arranged in a mixed manner (but a plurality of units of each type may be continuously arranged together)," instead of being concentrated in different positions of second sub-region 922.

In an exemplary embodiment, in the first sub-region 921, a quantity C of multiplexing units 2 included in the multiplexing unit group between two adjacent driving unit groups and a gap size D between two adjacent driving unit groups satisfy the following relationship:

$$D=a*C+(C+1)*d1;$$

where a is a size of each multiplexing unit 2 along an arrangement direction of the multiplexing unit 2, and d1 is a gap size between adjacent multiplexing units 2.

In an exemplary embodiment, in the second sub-region 922, a quantity E of test units 3 included in the test unit group between two adjacent driving unit groups and a gap size F between two adjacent driving unit groups satisfy the following relationship:

$$F=b*E+(E+1)*d2;$$

where b is a size of each test unit 3 along an arrangement direction of the test unit 3, and d2 is a gap size between adjacent test units 3.

In an exemplary embodiment, a gap between two adjacent units (for example the multiplexing unit 2, the testing unit 3, and the driving unit 4) is 1 micron to 5 microns. Exemplarily, a gap between two adjacent driving units 4 (or two adjacent multiplexing units 2 or two adjacent testing units 3) may be 1.5 microns, a gap between the driving unit 4 and multiplexing unit 2 adjacent to each other may be 1.5 microns, and the gap between the driving unit 4 and the testing unit 3 adjacent to each other may be 1.5 microns.

Among them, the above "gap" refers to a shortest straight line distance between devices belonging to two adjacent units.

Obviously, each circuit in the circuit region 92 also needs a certain signal to work, so the peripheral region also includes a joint region 94 for introducing these signals. The joint region 94 includes a plurality of joints 6, and the joints 6 are connected with signal lines, which may include a multiplexing signal line 62, a test signal line 63, a driving signal line 64, etc., which supply power to the multiplexing unit 2, test unit 3 and driving unit 4 respectively. Of course, each signal line is connected with a corresponding unit and a corresponding joint 6.

The joint 6 (Pad or Pin) refers to the structure in the display substrate that can acquire other signals and introduce the signals into the signal lines.

Specifically, the joint 6 may be used for bonding connection with a flexible printed circuit board (FPC) or a driving chip, so as to obtain signals from the FPC or the driving chip.

Or, the joint 6 can also be used to contact with a test probe of a test apparatus, so as to obtain a signal from the test probe.

Referring to FIG. 1, FIG. 2, FIG. 4 and FIG. 5, the above joint region 94 is disposed on a side (i.e., an outer side) of the circuit region 92 away from the display region 91, and a fan-out region 93 is also disposed between the joint region 94 and the first sub-region 921. The fan-out region 93 includes a plurality of multiplexing signal lines 62, that is, after being led out from the joint region 94, the multiplexing signal lines 62 are connected with corresponding multiplexing units 2 through the fan-out region 93.

Generally speaking, the quantity of multiplexing signal lines 62 is far more than the sum of the test signal lines 63 and the driving signal lines 64. Therefore, by disposing the fan-out region 93 between the joint region 94 and the first sub-region 921 of the circuit region 92, multiplexing signal lines 62 with a large quantity can be connected with the multiplexing unit 2 "nearby". While the driving signal lines 64 and the test signal lines 63 need to extend a long distance to be connected with the driving unit 4 and the test unit 3, the total length of their leads will not be too large because the quantity of the driving signal lines 64 and the test signal lines 63 is smaller. Therefore, the above design can reduce the total length of the leads and a layout region occupied, reduce the bezel of the display apparatus, and improve the screen-to-body ratio.

Of course, except for the multiplexing signal lines 62, some of the driving signal lines 64 and the test signal lines 63 may be located in the fan-out region 93.

Referring to FIG. 1 and FIG. 2, since there is no fan-out region 93 on a side where the second sub-region 922 is located (the upper side in FIG. 1 and FIG. 2), there may be a space for other structures on this side, so a capacitor region 95 can be disposed between the second sub-region 922 and the display region 91, and a plurality of compensation capacitor units 5 connected with the data lines 11 are disposed in the capacitor region 95 to compensate the capacitance difference of different data lines 11, and its function will be described in detail later.

Referring to FIG. 1, FIG. 2, FIG. 4, and FIG. 5, respective units (the multiplexing unit 2, the test unit 3, and the driving unit 4) in the display substrate according to the embodiment of the present disclosure are arranged in a mixed manner, so that each unit may provide a signal to a corresponding data line 11, a corresponding gate line 12, etc. nearby. At the same time, various structures are relatively evenly distributed, which makes full use of the space at each position of the display substrate, reduces the bezel of the display device, and improves the screen-to-body ratio.

In some embodiments, the first sub-region 921 includes a first circular arc region, and the second sub-region 922 includes a second circular arc region. An edge of the first circular arc region 921 close to the display region 91 is closer to a center of the display region 91 than an edge of the second circular arc region close to the display region 91.

Figure 14:
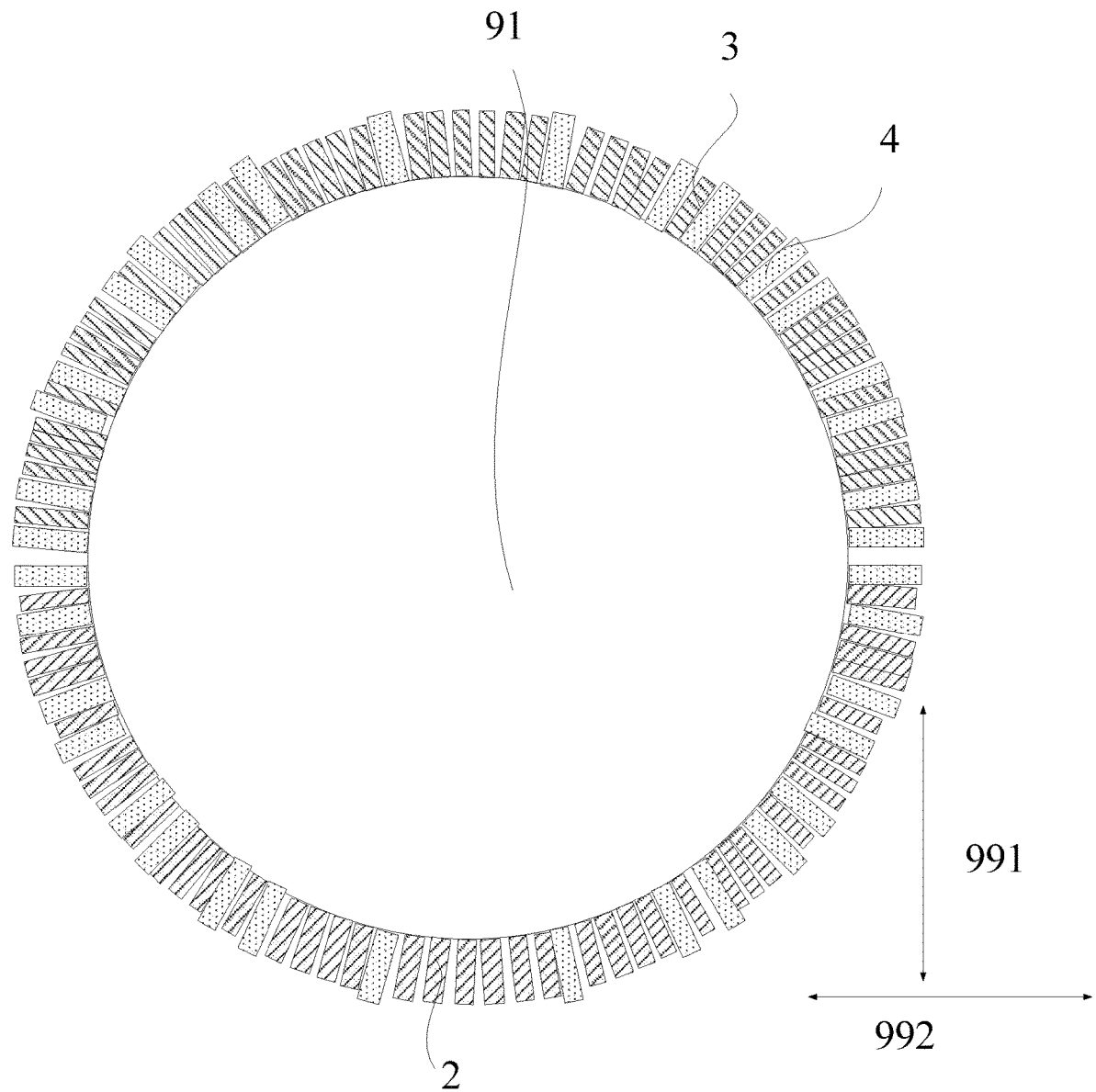
FIG. 14 is a schematic diagram of distribution density of different units in a display substrate according to an embodiment of the present disclosure.

Referring to FIG. 1, FIG. 2 and FIG. 14, the first sub-region 921 and the second sub-region 922 may include a "circular arc shape (circular annulus shape)" portion.

Exemplarily, a main surface of the display substrate can be basically circle shape, and the display region 91 is also basically circle shape, so that the circuit region 92 is basically circular annular shape around the circular display region 91, while the first sub-region 921 and the second sub-region 922 are respectively "semi-circular annulus" ("an upper semi-circular annulus" and "a lower semi-circular annulus" in FIG. 1 and FIG. 2), and their openings are opposite.

Furthermore, the edge of the first circular arc region (the first sub-region 921) close to the display region 91 is closer to the center of the display region 91 than the edge of the second circular arc region (the second sub-region 922) near to the display region 91. In other words, an inner side of the first circular arc region is smaller than that of the second circular arc region, because the capacitor region 95 is also disposed inside the second sub-region 922.

In some embodiments, a circle center of the first circular arc region (the first sub-region 921) is the same as a circle center of the second circular arc region (the second sub-region 922), and a radius of an edge of the first circular arc region close to the display region 91 is smaller than that of an edge of the second circular arc region close to the display region 91 by 210 microns to 420 microns.

Exemplarily, the first circular arc region and the second circular arc region above can be concentric, and the difference between their inner diameters may be 210 microns to 420 microns (an inner diameter of the first circular arc region is smaller), and further may be 250 microns to 350 microns.

The main surface of the display substrate may be a side surface of its substrate, that is, the surface of the substrate of the display substrate according to the embodiment of the present disclosure may be circle shape.

Among them, the substrate is the foundation for bearing other structures on the display substrate. The substrate is a basically sheet-like structure made of glass, silicon (for example monocrystalline silicon), polymer materials (for example polyimide), etc., and may be rigid or flexible, and its thickness may be in the order of millimeters.

In the embodiment of the present disclosure, "A is basically B" means that it conforms to the feature B on the whole scale of A, but it may not completely conform to the feature B on the scale obviously smaller than the whole scale of A. For example, "A is basically circle shape" means that A can be a perfect circle shape or ellipse shape, or the shape of A is circle shape or ellipse shape as a whole, but some of its details are not strictly circle shape. For example, a few parts of a boundary of A may be straight lines, bend lines, etc. For another example, some parts of the boundary of A may have protrusions, depressions, etc. For another example, a few parts of the boundary of A may be arcs that are similar to circular arcs but not strictly circular arcs. For another example, the boundaries of different positions of A can be circular arcs with different diameters.

Referring to FIG. 1 and FIG. 2, when the circuit region 92 is circular annulus shape, most of its positions correspond to the data lines 11 and the gate lines 12 at the same time (that is, there are corresponding sub-pixels 1 in both the row direction and the column direction). Therefore, in this case, the multiplexing units 2, the test units 3 and the driving units 4 are arranged in the circuit region 92 in a mixed manner, which is most beneficial for each unit to be connected with the corresponding data line 11, the corresponding gate line 12 and so on nearby.

Of course, the above shapes are not limited to the specific forms of the display substrate and various regions thereof, and the display substrate and various regions thereof can also have other shapes.

For example, in other embodiments, the first sub-region 921 includes a first U-shaped annulus region and the second sub-region 922 includes a second U-shaped annulus region.

Figure 4:
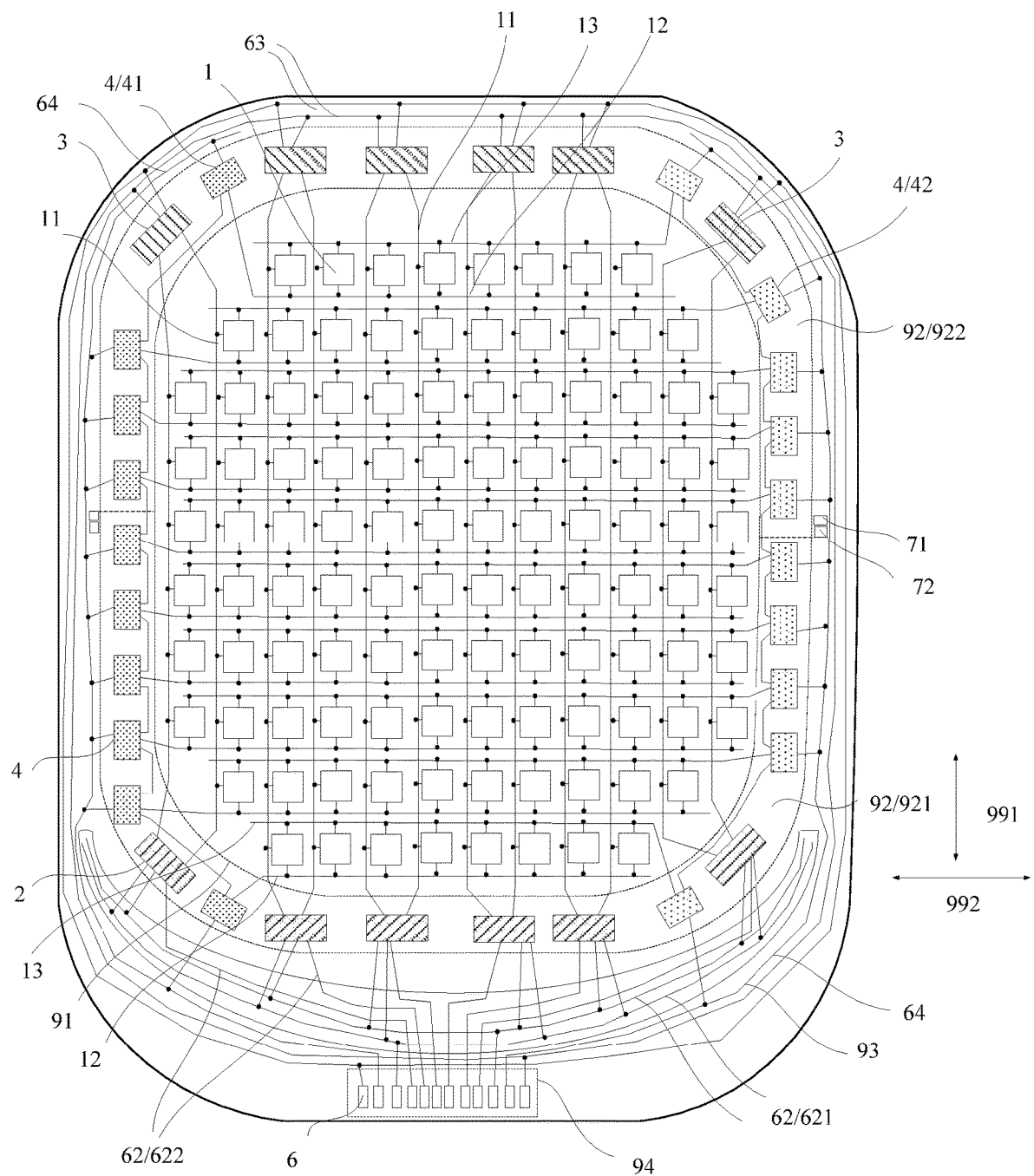
FIG. 4 is a schematic diagram of a structure of another display substrate according to an embodiment of the present disclosure.
Figure 5:
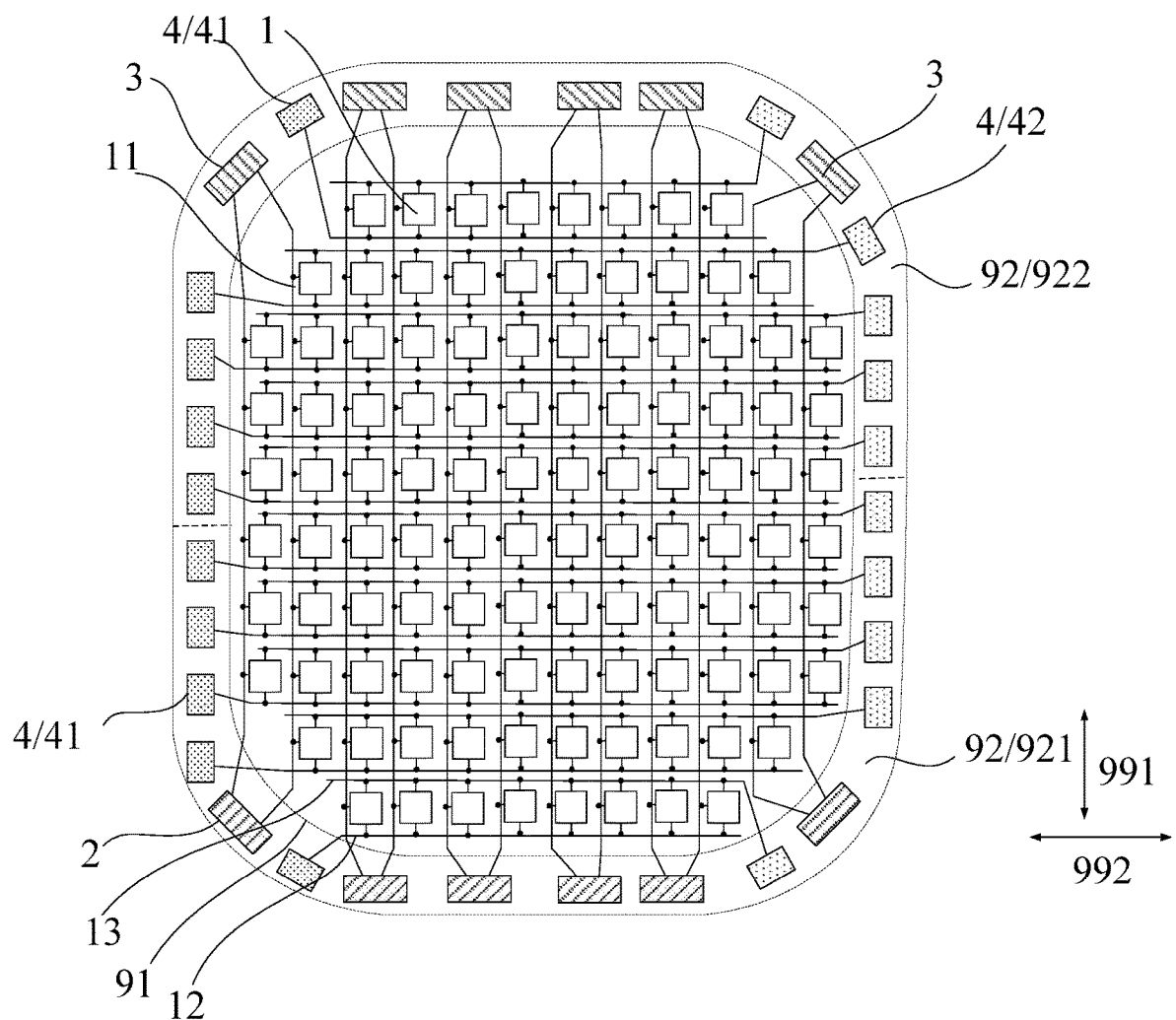
FIG. 5 is a schematic diagram of a structure of another display substrate according to an embodiment of the present disclosure (some leads are not shown)
Figure 15:
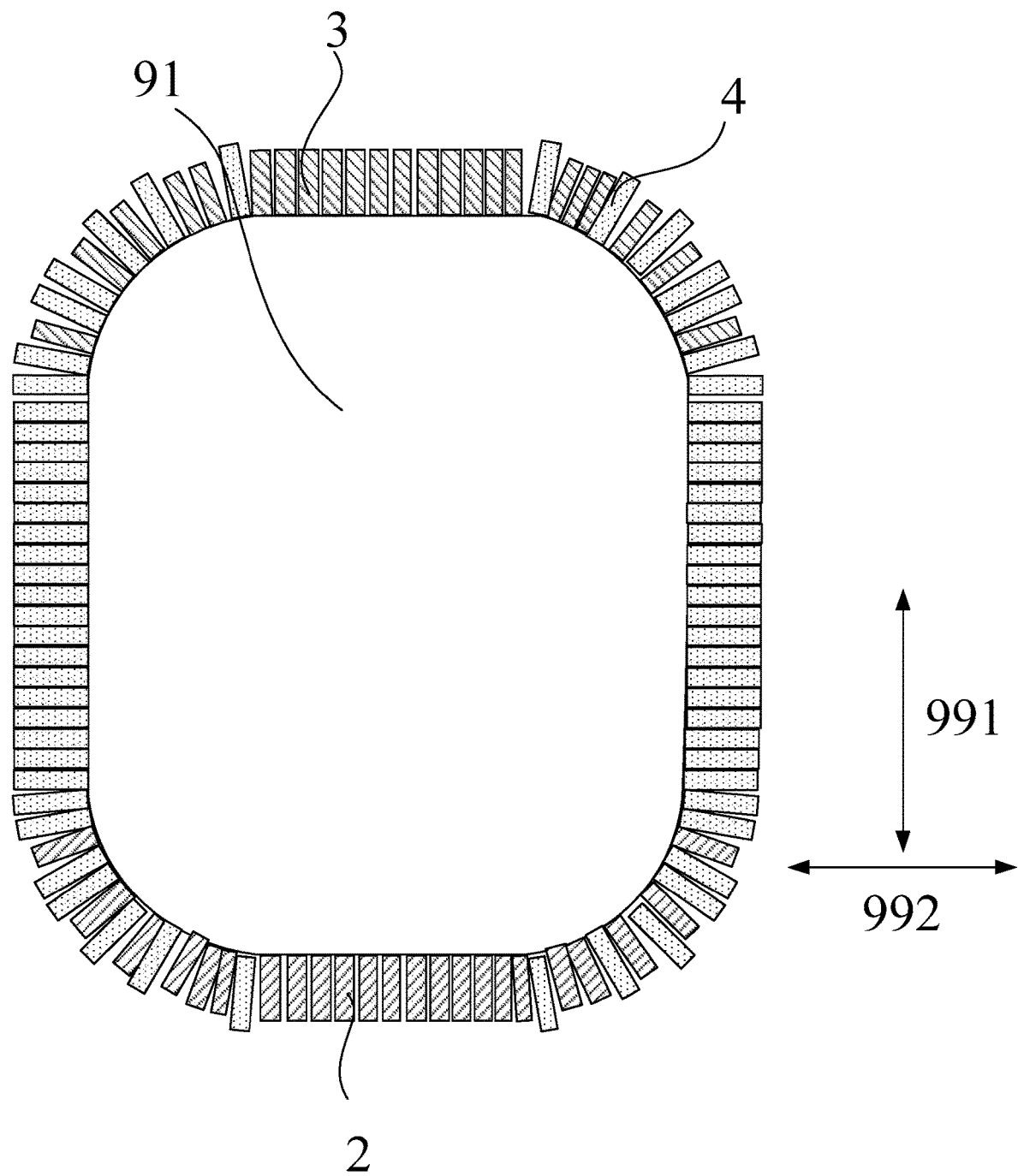
FIG. 15 is a schematic diagram of distribution density of different units in another display substrate according to an embodiment of the present disclosure.

Referring to FIG. 4, FIG. 5 and FIG. 15, as another form of the embodiment of the present disclosure, the main surface of the display substrate may be basically a rectangle shape with arc angle, and the display region 91 is also basically a rectangle shape with arc angle, so that the circuit region 92 is basically a rectangle shape annulus with arc angle around the circular display region 91.

Therefore, the first sub-region 921 and the second sub-region 922 are respectively "U-shaped annulus" (in FIG. 4 and FIG. 5, they are respectively "an upper U-shaped annulus" and "a lower U-shaped annulus", and their openings are opposite to each other). Of course, a bottom of the U-shaped annulus is straight line form, not arc shape.

Among them, the "arc angle rectangle" refers to a shape similar to a rectangle, which has four straight sides. However, it is different from the rectangle in that its four corners are not right angles, but "arc angles" of relatively uniform transition. Furthermore, its four corners may be rounded angles, that is, the arc angle rectangle may be rounded rectangular.

Accordingly, the circuit region 92 is an "arc angle rectangular annulus", that is, an annulus region sandwiched between two "arc angle rectangles" with different sizes, so it can also be regarded as a "hollow arc angle rectangle." Of course, furthermore, the circuit region 92 can also be a "rounded rectangular annulus" (i.e., a "hollow rounded rectangle").

In some embodiments, a width of the first U-shaped annulus region (i.e., a distance between two straight line parts of the U-shape) is approximately equal to that of the second U-shaped annulus region, while a height of the first U-shaped annulus region (i.e., a distance a bottom to an opening of the U-shape) is approximately equal to that of the second U-shaped annulus region.

Referring to FIG. 4 and FIG. 5, the sizes of the first U-shaped annulus region and the second U-shaped annulus region may be substantially the same, so that they may be basically "symmetrical up and down."

In some embodiments, an inner edge of the first U-shaped annulus region (i.e., an outer edge of the display region 91) includes two sections of first arc boundaries, and an inner edge of the second U-shaped annulus region (i.e., an outer edge of the display region 91) includes two sections of second arc boundaries. The inner edge of the circuit region (that is, the outer edge of the display region 91) also includes two first straight line boundaries extending along the first direction 991 (each first straight line boundary crosses the first sub-region 921 and the second sub-region 922), a second straight line boundary (belonging to the first sub-region 921) and a third straight line boundary (belonging to the second sub-region 922) extending along the second direction 992.

Of course, it should be understood that the outer edges of the first sub-region 921 and the second sub-region 922 (i.e., the outer edges of the circuit region 92) should have shapes basically similar to the inner edges thereof.

Furthermore, at any point on the inner edge of the circuit region 91, the distance from the normal direction to the outer edge may be the same, that is, the "width" of each position of the circuit region 91 may be the same.

In some embodiments, in the first sub-region 921 and the second sub-region 922, a plurality of driving units 4 are disposed along a first straight line boundary. In the first sub-region 921, a plurality of multiplexing units 2 are disposed along a second straight line boundary. In the second sub-region 922, a plurality of test units 3 are disposed along a third straight line boundary.

In some embodiments, in the first sub-region 921, the driving units 4 and the multiplexing units 2 are alternately disposed along the first arc boundary. In the second sub-region 922, the driving units 4 and the test units 3 are alternately disposed along the second arc boundary.

That is, referring to FIG. 4 and FIG. 5, when the first sub-region 921 and the second sub-region 922 are in the form of the above "arc angle rectangular annulus", only different units at a corresponding "arc angle of the rectangular annulus" are arranged in mixed manner, while there is only one unit at a corresponding "straight side of the rectangular annulus."

In some embodiments, in the first sub-region 921, the connection track of the center points of the coverage regions of a plurality of driving unit groups is a first circular arc track, and the connection track of the center points of the coverage regions of a plurality of multiplexing unit groups is a second circular arc track, and the circle centers corresponding to the first circular arc track and the second circular arc track substantially coincide with the circle centers corresponding to the first arc boundary.

In this embodiment, the circle centers corresponding to the first circular arc track and the second circular arc track substantially coincide with the circle centers corresponding to the first arc boundary, which means that the circle centers corresponding to the first circular arc track and the second circular arc track may completely coincide with the circle centers corresponding to the first arc boundary, or a distance between the respective circle centers is smaller than 10 microns.

In some embodiments, in the second sub-region 922, the connection track of center points of coverage regions of a plurality of driving unit groups is a third circular arc track, and the connection track of center points of coverage regions of a plurality of test unit groups is a fourth circular arc track, and the circle centers corresponding to the third circular arc track and the fourth circular arc track substantially coincide with the circle centers corresponding to the second arc boundary.

In this embodiment, the circle centers corresponding to the third circular arc track and the fourth circular arc track substantially coincide with the circle centers corresponding to the second arc boundary, which means that the circle centers corresponding to the third arc track and the fourth arc track can completely coincide with the centers corresponding to the second arc boundary, or the distance between the circle centers is smaller than 10 microns.

That is, referring to FIG. 4 and FIG. 5, in each sub-region, each unit at a corresponding arc boundary is respectively arranged along a circular track, and circles corresponding to circular tracks of two units at the same arc boundary and circles corresponding to the arc boundary itself are concentric or approximately concentric.

In some embodiments, in the first sub-region 921, the multiplexing unit groups include a first multiplexing unit group and a second multiplexing unit group. The first multiplexing unit group includes M multiplexing units 2, and the second multiplexing unit group includes N multiplexing units 2, where N and M are integers greater than 1 and M<N, the second multiplexing unit group is located in the middle of the first sub-region 921 and the first multiplexing unit group is located at two ends of the first sub-region 921 away from the middle of the first sub-region 921;

And/or

In the second sub-region 922, the test unit groups include a first test unit group and a second test unit group. The first test unit group includes K test units 3, and the second test unit group includes L test units, where L and K are integers greater than 1, and K<L. The second test unit group is located in the middle of the second sub-region 922, and the first test unit group is located at two ends of the second sub-region 922 away from the middle of the second sub-region 922.

At least one second multiplexing unit group is disposed in the middle of the first sub-region 921 (i.e., at the arc top of the semi-circular annulus), and each second multiplexing unit group includes N multiplexing units 2. At least one first multiplexing unit group is disposed at two ends of the first sub-region 921 (i.e., two ends or an opening side of the semi-circular annulus), and each first multiplexing unit group includes M multiplexing units 2, and M is less than N.

That is, the quantity of multiplexing units 2 included in a multiplexing unit group (the second multiplexing unit group) in the middle of the first sub-region 921 is large, while the quantity of multiplexing units 2 included in a multiplexing unit group (the first multiplexing unit group) at two ends of the first sub-region 921 is small. Therefore, on the whole, in the middle of the first sub-area 921, the quantity of multiplexing units 2 is large, and the quantity of driving units 4 is small. At two ends of the first sub-region 921, the quantity of multiplexing units 2 is small, and the quantity of driving units 4 is large.

Among them, in some embodiments, N may be 7, or 6, or 5. And in some embodiments, M may be 1, or 2, or 3.

In some embodiments, there may be other multiplexing unit groups between the first multiplexing unit group and the second multiplexing unit group, and the quantity of multiplexing units in these multiplexing unit groups may be larger than M but smaller than N.

At least one second test unit group is disposed in the middle of the second sub-region 922 (i.e., at an arc top of the semi-circular annulus), and each second test unit group includes L test units 3. At least one first test unit group is disposed at two ends of the second sub-region 922 (i.e., two ends or an opening side of the semi-circular annulus), and each first test unit group includes K test units 3, and K is less than L.

That is, the quantity of test units 3 included in a test unit group (the second test unit group) in the middle of the second sub-region 922 is large, and the quantity of test units 3 included in a test unit group (the first test unit group) at two ends of the first sub-region 921 is small. Therefore, on the whole, in the middle of the second sub-region 922, the quantity of test units 3 is large and the quantity of driving units 4 is small, while at two ends of the second sub-region 922, the quantity of test units 3 is small and the quantity of driving units 4 is large.

Among them, in some embodiments, L may be 7, or 6, or 5. And in some embodiments, K may be 1, or 2, or 3.

In some embodiments, there may be other test unit groups between the first test unit group and the second test unit group, and the quantity of test units in these test unit groups may be larger than K but smaller L.

In some embodiments, in the first sub-region 921, the distribution density of the driving units 4 gradually decreases and the distribution density of the multiplexing units 2 gradually increases in a direction from two ends of the first sub-region 921 to the middle of the first sub-region 921.

In the second sub-region 922, the distribution density of the driving units 4 gradually decreases and the distribution density of the test units 3 gradually increases in a direction from two ends of the second sub-region 922 to the middle of the second sub-region 922.

In each sub-region of the circuit region 92, in a direction from two ends of the sub-region (that is, a position adjacent to another sub-region) to the middle of the sub-region (that is, a position farthest away from the position adjacent to another sub-region), the distribution density of the driving units 4 gradually decreases, and the distribution density of the test units 3 gradually increases.

Among them, the increase in the distribution density of units A along a certain direction does not mean that the quantity of units A at each position where units A are alternately disposed along this direction increases in sequence, but as long as the overall distribution in a relatively large region shows that the quantity of units A gradually increases along this direction.

Among them, the decrease in the distribution density of units A along a certain direction does not mean that the quantity of units A at each position where units A are alternately disposed along this direction decreases in sequence, but as long as the overall distribution in a relatively large region shows that the quantity of units A gradually decreases along this direction.

Exemplary, when the first sub-region 921 and the second sub-region 922 respectively include the above first circular arc region and the second circular arc region, referring to FIG. 1 and FIG. 2, in the above two semi-circular annular sub-regions, the closer to the arc top (upper and lower sides in FIG. 1 and FIG. 2) of the semi-circular annulus is, the smaller the quantity of rows of sub-pixels 1 corresponding to the same arc length (or corresponding to the same circle central angle) range is (that is, the smaller the quantity of corresponding gate lines 12 is), and the larger the quantity of columns of corresponding sub-pixels 1. On the contrary, the closer to the two ends or opening sides of the two semi-circular annuluses (the middle along a longitudinal direction in each drawing), the smaller the quantity of columns of sub-pixels 1 corresponding to the same arc length (or corresponding to the same circle central angle) range is (that is, the smaller the quantity of corresponding data lines 11 is), and the larger the quantity of rows of corresponding sub-pixels 1 is (that is, the larger the quantity of corresponding gate lines 12 is).

Therefore, referring to FIG. 1 and FIG. 2, if each unit can be connected with the corresponding row and column nearby, the closer to the arc top of the semi-circular annulus is, the larger the quantity of multiplexing units 2 or test units 3 is, and the smaller the quantity of driving units 4 is. On the contrary, the closer to the opening of the semi-circular annulus is, the smaller the quantity of multiplexing units 2 or test units 3 is and the larger the quantity of driving units 4 is, that is, the "distribution density" of each driving unit 4 conforms to the above rule.

Of course, the specific distribution position and the quantity of each unit in the circuit region 92 should be determined according to the specific distribution position and quantity of gate lines 12 and data lines 11 in the display region 91, so as to make each unit as close as possible to its own connection lead.

Exemplarily, when the first sub-region 921 and the second sub-region 922 are respectively the above first U-shaped annular region and the second U-shaped annular region, referring to FIG. 4 and FIG. 5, the distribution densities of the multiplexing units 2, the testing units 3 and the driving units 4 also conform to the above rule.

That is, in the above two U-shaped annulus regions, the closer to the top of the U-shaped annulus regions (upper and lower ends in FIG. 4 and FIG. 5) is, the smaller the quantity of rows of sub-pixels 1 corresponding to the same side length range is (that is, the smaller the quantity of corresponding gate lines 12 is), and the larger the quantity of columns of corresponding sub-pixels 1 is (that is, the larger the quantity of corresponding data lines 11 is). On the contrary, the closer to two ends of the two U-shaped annulus regions (the middle along the longitudinal direction in FIG. 4 and FIG. 5) is, the smaller the quantity of columns of sub-pixels 1 corresponding to the same side length range is (i.e., the smaller the quantity of corresponding data lines 11 is), and the larger the quantity of rows of corresponding sub-pixels 1 is (i.e., the larger the quantity of corresponding gate lines 12 is).

Therefore, referring to FIG. 4 and FIG. 5, if each unit can be connected with the corresponding row and column nearby, the closer to the top of the U-shaped annulus region is, the larger the quantity of multiplexing units 2 or test units 3 is, and the smaller the quantity of driving units 4 is. On the contrary, the closer to two ends of the U-shaped annulus region, the smaller the quantity of multiplexing units 2 or test units 3 is and the larger the quantity of driving units 4 is, that is, the "distribution density" of respective driving units 4 conforms to the above rule.

In FIG. 1, FIG. 2, FIG. 4 and FIG. 5, in order to clearly show other structures, the quantity of each unit is small, so the distribution density of each unit can be shown in FIG. 14 and FIG. 15 for more details.

In some embodiments, the circuit region 92 is divided into a first half region and a second half region which are opposite to each other on two sides of the display region 91 along the second direction 992.

The driving unit 4 includes a plurality of gate driving units 41.

The first half region includes the plurality of gate driving units 41 configured to provide gate driving signals to the plurality of gate lines 12.

Referring to FIG. 1, FIG. 2, FIG. 4 and FIG. 5, the circuit region 92 can also be divided into two "half regions" which are opposite to each other at two sides of the display region 91 along the second direction 992, and each "half region" is also basically semi-circular annulus (e.g., a left semi-circular annulus and a right semi-circular annulus in FIG. 1 and FIG. 2) or U-shape (e.g., a left semi-U-shaped annulus and a right semi-U-shaped annulus in FIG. 4 and FIG. 5).

Since the gate lines 12 extend along the second direction 992, all the gate lines 12 correspond to the first half region (the left semi-circular annulus in FIG. 1 and FIG. 2, or the left semi-U-shaped annulus in FIG. 4 and FIG. 5). Therefore, the driving units 4 in the first half region may include the gate driving units 41 that provide gate driving signals to the plurality of gate lines 12 (further, the driving units 4 in the first half region 921 may all be the gate driving units 41), so that the gate driving units 41 are connected with corresponding gate lines 12 nearby.

Specifically, each gate driving unit 41 may be a gate shift register (GOA), and a plurality of gate shift registers are cascaded, so that the plurality of gate shift registers may provide driving signals to a plurality of gate lines 12 respectively.

A specific form of the gate shift register may be various. For example, referring to FIG. 9 and FIG. 10, a circuit structure and a driving timing of the gate shift register are shown. A low level of each signal as followed may be specifically equal to a low level signal VGL, and a high level of each signal as followed may be specifically equal to a high level signal VGH.

In an input phase t1, a first gate clock signal CK is at a low level, a second gate clock signal CB is at a high level, and an input signal STV is at a low level. Since the first gate clock signal CK is at the low level, a second gate transistor K2 is turned on, and the input signal STV is transmitted to a third gate node N3 via the second gate transistor K2. Since the second gate transistor K2 has threshold loss, a level of the third gate node N3 is STV−Vth2, that is, VGL−Vth2, where Vth2 represents a threshold level of the second gate transistor K2. Since a gate of a sixth gate transistor K6 receives a low level signal VGL, the sixth gate transistor K6 is in a turn-on state, and thus a level of VGL−Vth2 is transmitted to the first gate node N1 via the sixth gate transistor K6. For example, a threshold level of the sixth gate transistor K6 is expressed as Vth6. Similarly, since the sixth gate transistor K6 has threshold loss, the level of the first gate node N1 is VGL−VthN1, where VthN1 is a smaller one of Vth2 and Vth6. The level of the first gate node N1 can control an eighth gate transistor K8 to be turned on, and a second gate clock signal CB is used as a gate output signal GOUT via the eighth gate transistor K8, that is, in the input phase t1, the gate output signal GOUT is the second gate clock signal CB with a high level, that is, equal to VGH.

In the input phase t1, since the first gate clock signal CK is at the low level, the first gate transistor K1 is turned on, and the low level signal VGL is transmitted to the second gate node N2 via the first gate transistor K1. Since the level of the third gate node N3 is VGL−Vth2, a seventh gate transistor K7 is turned on, and the first gate clock signal CK with the low level is transmitted to the second gate node N2 via the seventh gate transistor K7. For example, a threshold level of the seventh gate transistor K7 is expressed as Vth7, and the threshold level of the first gate transistor K1 is expressed as Vth1. If Vth1<Vth7+Vth2, the level of the second gate node N2 is VGL−Vth7−Vth2. And if Vth1>Vth7+Vth2, the level of the second gate node N2 is VGL−Vth1. At this time, both the third gate transistor K3 and a fourth gate transistor K4 are turned on. A fifth gate transistor K5 is turned off because the second gate clock signal CB is at the high level.

In an output phase t2, the first gate clock signal CK is at a high level, the second gate clock signal CB is at a low level, and an input signal SKT is at a high level. The eighth gate transistor K8 is turned on, and the second gate clock signal CB is used as a gate output signal GOUT via the eighth gate transistor K8. In the input phase t1, a level of one end of the second gate capacitor C2 connected with the first gate node N1 is VGL−VthN1, and a level of the other end of the second gate capacitor C2 is a high level. In the output phase t2, a level of one end of the second gate capacitor C2 connected with the output terminal GOUT is changed to VGL. Due to the bootstrap effect of the second gate capacitor C2, the level of one end of the second gate capacitor C2 connected with the first gate node N1 is changed to 2VGL−VthN1−VGH, that is, the level of the first gate node N1 is changed to 2VGL−VthN1−VGH. At this time, the sixth gate transistor K6 is turned off, the eighth gate transistor K8 can be turned on better, and the gate output signal GOUT is the low level signal VGL.

In the output phase t2, the first gate clock signal CK is at a high level, so that both the second gate transistor K2 and the first gate transistor K1 are turned off. The level of the third gate node N3 is still VGL−VthN1, the seventh gate transistor K7 is turned on, and the first gate clock signal CK with a high level is transmitted to the second gate node N2 via the seventh gate transistor K7, that is, the level of the second gate node N2 is VGH, so that both the third gate transistor K3 and the fourth gate transistor K4 are turned off. The fifth gate transistor K5 is turned on because the second gate clock signal CB is at a low level.

In a buffering phase t3, both the first gate clock signal CK and the second gate clock signal CB are at a high level, and the input signal SKT is at a high level. The eighth gate transistor K8 is turned on, and the second gate clock signal CB is used as a gate output signal GOUT via the eighth gate transistor K8. At this time, the gate output signal GOUT is the second gate clock signal CB with a high level, that is, VGH. Due to the bootstrap effect of the second gate capacitor C2, the level of the first gate node N1 is changed to VGL−VthN1.

In the buffering phase t3, the first gate clock signal CK is at a high level, so that both the second gate transistor K2 and the first gate transistor K1 are turned off. The level of the first gate node N1 is changed to VGL−VthN1. At this time, the sixth gate transistor K6 is turned on, the level of the third gate node N3 is also VGL−VthN1. The seventh gate transistor K7 is turned on, and the first gate clock signal CK with a high level is transmitted to the second gate node N2 via the seventh gate transistor K7, that is, the level of the second gate node N2 is VGH, so that both the third gate transistor K3 and the fourth gate transistor K4 are turned off. Since the second gate clock signal CB is at a high level, the fifth gate transistor K5 is turned off.

In a first sub-phase t41 of a stabilization phase t4, the first gate clock signal CK is at a low level, the second gate clock signal CB is at a high level, and the input signal SKT is at a high level. Since the first gate clock signal CK is at a low level, the second gate transistor K2 is turned on, and the input signal SKT is transmitted to the third gate node N3 via the second gate transistor K2. Since the second gate transistor K2 transmits a high level without threshold loss, the level of the third gate node N3 is VGH, and the seventh gate transistor K7 is turned off. Since the sixth gate transistor K6 is in a turn-on state, the level of the first gate node N1 is the same as that of the third gate node N3, that is, the level of the first gate node N1 is VGH, and the eighth gate transistor K8 is turned off. Since the first gate clock signal CK is at low level, the first gate transistor K1 is turned on, the level of the second gate node N2 is VGL−Vth1, both the third gate transistor K3 and the fourth gate transistor K4 are turned on, and the high level signal VGH is transmitted as the gate output signal GOUT via the third gate transistor K3, that is, the gate output signal is the high level signal VGH.

In a second sub-phase t42 of the stabilization phase t4, the first gate clock signal is at a high level, the second gate clock signal is at a low level, and the input signal SKT is at a high level. The levels of the first gate node N1 and the third gate node N3 are VGH, and both the eighth gate transistor K8 and the seventh gate transistor K7 are turned off. The first gate clock signal CK is at a high level, so that both the second gate transistor K2 and the first gate transistor K1 are turned off. Due to the holding effect of the first gate capacitor C1, the level of the second gate node N2 is still VGL−Vth1, and both the third gate transistor K3 and the fourth gate transistor K4 are turned on. The high level signal VGH is used as the gate output signal GOUT via the third gate transistor K3, that is, the gate output signal is the high level signal VGH.

In the second sub-phase t42, since the second gate clock signal CB is at a low level, the fifth gate transistor K5 is turned on, the high level signal VGH is transmitted to the third gate node N3 and the first gate node N1 via the fourth gate transistor K4 and the fifth gate transistor K5 to maintain the levels of the first gate node N1 and the third gate node N3 at a high level.

In a third sub-phase t43 of the stabilization phase t4, both the first gate clock signal CK and the second gate clock signal CB are at a high level, and the input signal SKT is at a high level. The levels of the first gate node N1 and the third gate node N3 are VGH, and the eighth gate transistor K8 and the seventh gate transistor K7 are turned off. The first gate clock signal CK is at a high level, so that the second gate transistor K2 and the first gate transistor K1 are both turned off, the level of the second gate node N2 is still VGL−Vth1, and both the third gate transistor K3 and the fourth gate transistor K4 are turned on. The high level signal VGH is used as the gate output signal GOUT via the third gate transistor K3, that is, the gate output signal is the high level signal VGH.

In some embodiments, the display region 91 further includes a plurality of control electrode lines 13 extending along the second direction 992, and each control electrode line 13 is connected with a plurality of sub-pixels 1.

The driving unit 4 is a control electrode driving unit 42.

The second half region includes a plurality of control electrode driving units 42 configured to provide control electrode driving signals to the plurality of control electrode lines 13.

Referring to FIG. 1, FIG. 2, FIG. 4 and FIG. 5, the display region 91 can also be provided with control electrode lines 13 extending along the second direction 992, and each control electrode line 13 may be connected with one or two rows of sub-pixels 1, and specifically may be connected with a control electrode line terminal EM of the above 7T1C pixel circuit.

Among them, since the control electrode lines 13 also extend along the second direction 992, all the control electrode lines 13 correspond to the second half region (the right semi-circular annulus in FIG. 1 and FIG. 2, or the right semi-U-shaped annulus in FIG. 4 and FIG. 5). Therefore, the driving units 4 in the second half region may include the control electrode driving units 42 providing control electrode driving signals to a plurality of control electrode lines 13 (further, it may be that the driving units 4 in the second half region 922 are all control electrode driving units 42), so that the control electrode driving units 42 are connected with the corresponding control electrode lines 13 nearby.

Therefore, referring to FIG. 1, FIG. 2, FIG. 4 and FIG. 5, in the circuit region 92 of the display substrate according to the embodiment of the present disclosure, the test units 3 and gate driving units 41 are arranged in the upper left region in a mixed manner, the test units 3 and control electrode driving units 42 are arranged in the upper right region in a mixed manner, the multiplexing units 2 and gate driving units 41 are arranged in the lower left region in a mixed manner, and the multiplexing units 2 and the control electrode driving units 42 are arranged the lower right region in a mixed manner.

With reference to FIG. 1 and FIG. 2, since the radial directions of different positions of the circular annulus are different, each unit above arranged in the annulus may alternatively be "rotated" with different arrangement positions, and generally, it is always ensured that its output terminal faces the circle center.

In addition, referring to FIG. 4 and FIG. 5, each unit corresponding to the above "arc boundary" may be alternatively "rotated" along with different arrangement positions, and generally, it is always ensured that its output terminal faces the circle center.

Of course, it should be understood that each unit and each sub-pixel 1 in FIG. 1, FIG. 2, FIG. 4 and FIG. 5 are represented by "rectangle", which is only schematic. In fact, each unit and each sub-pixel 1 are formed by a plurality of devices, and their occupied region are not necessarily rectangle.

Of course, it should be understood that for the actual display substrate, each unit only corresponds to a small part of the circular annular shape, so in the subsequent partial drawings, many structures at the local part of each unit are approximately treated as straight lines.

Of course, it should be understood that the shapes, sizes, size ratios, quantity, quantity ratios, positions, etc. of various structures such as leads (for example signal lines), joints, cells and regions of sub-pixel 1 in many drawings of the embodiment of the present disclosure are only examples based on limitation of area, but not limitations of the embodiment of the present disclosure. For example, the actual quantity of test signal lines 63, driving signal lines 64, etc. should be more than that shown in FIG. 1, FIG. 2, FIG. 4 and FIG. 5.

Of course, the specific form of the above driving unit 4 is not a limitation of the embodiment of the present disclosure.

For example, the driving units 4 in the two half regions may be gate driving units 41, and provide gate driving signals to different gate lines 12 respectively, or provide gate driving signals for each gate line 12 from two sides at the same time (that is, double-sided driving).

Specifically, each control electrode driving unit 42 may be a control electrode shift register (EM GOA), and a plurality of control electrode shift registers are cascaded, so that the plurality of control electrode shift registers can provide driving signals to a plurality of control electrode lines 12 respectively.

The specific form of the control electrode shift register may be various. Exemplarily, a circuit structure and a driving timing of the control electrode shift register may refer to FIG. 11 and FIG. 12. A low level of each of following signals may be specifically equal to a low level signal VGL, and a high level of each signal may be specifically equal to a high level signal VGH.

In a first phase P1, a first control electrode clock signal CK' is at a low level, so the first control electrode transistor M1 and the third control electrode transistor M3 are turned on, and the turned on first control electrode transistor M1 transmits a start signal ESTV with a high level to a first control electrode node N1', so that a level of the first control electrode node N1' is changed to the high level, so a second control electrode transistor M2, an eighth control electrode transistor M8 and a tenth control electrode transistor M10 are turned off. In addition, the turned on third control electrode transistor M3 transmits the low level signal VGL with a low level to a second control electrode node N2', so that a level of the second control electrode node N2' is changed to a low level, so a fifth control electrode transistor M5 and a sixth control electrode transistor M6 are turned on. Since a second control electrode clock signal CB' is at a high level, the seventh control electrode transistor M7 is turned off. In addition, due to the storage effect of a third control electrode capacitor C3', a level of a fourth control electrode node N4 may be maintain at a high level, so that the ninth control electrode transistor M9 is turned off. In the first phase P1, since both the ninth control electrode transistor M9 and the tenth control electrode transistor M10 are turned off, a control electrode output signal EMOUT remains at a previous low level.

In a second phase P2, the second control electrode clock signal CB' is at a low level, so the fourth control electrode transistor M4 and the seventh control electrode transistor M7 are turned on. Since the first control electrode clock signal CK' is at a high level, the first control electrode transistor M1 and the third control electrode transistor M3 are turned off. Due to the storage effect of the first control electrode capacitor C1', the second control electrode node N2' may maintain the low level of the previous phase, so the fifth control electrode transistor M5 and the sixth control electrode transistor M6 are turned on. The high level signal VGH is transmitted to the first control electrode node N1' through the turned on fifth control electrode transistor M5 and fourth control electrode transistor M4, so that the level of the first control electrode node N1' continues to maintain the high level of the previous phase, so the second control electrode transistor M2, the eighth control electrode transistor M8 and the tenth control electrode transistor M10 are turned off. In addition, the second control electrode clock signal CB' with a low level is transmitted to the fourth control electrode node N4' through the turned on sixth and seventh control electrode transistors M6 and M7, so that the level of the fourth control electrode node N4' is changed to the low level, so the ninth control electrode transistor M9 is turned on, and the turned on ninth control electrode transistor M9 outputs the high level signal VGH, so the control electrode output signal EMOUT is at a high level.

In a third phase P3, the first control electrode clock signal CK' is at a low level, so the first control electrode transistor M1 and the third control electrode transistor M3 are turned on. Since the second control electrode clock signal CB' is at a high level, the fourth control electrode transistor M4 and the seventh control electrode transistor M7 are turned off. Due to the storage effect of the third control electrode capacitor C3', the level of the fourth control electrode node N4' may maintain at the low level of the previous phase, so that the ninth control electrode transistor M9 maintains a turn-on state, and the turned on ninth control electrode transistor M9 outputs the high level signal VGH, so the control electrode output signal EMOUT is still at a high level.

In a fourth phase P4, the first control electrode clock signal CK' is at a high level, so the first control electrode transistor M1 and the third control electrode transistor M3 are turned off. The second control electrode clock signal CB' is at a low level, so the fourth control electrode transistor M4 and the seventh control electrode transistor M7 are turned on. Due to the storage effect of the second control electrode capacitor C2', the level of the first control electrode node N1' maintains the high level of the previous phase, so that the second control electrode transistor M2, the eighth control electrode transistor M8 and the tenth control electrode transistor M10 are turned off. Due to the storage effect of the first control electrode capacitor C1', the second control electrode node N2 continues to maintain the low level of the previous phase, so that the fifth control electrode transistor M5 and the sixth control electrode transistor M6 are turned on. In addition, the second control electrode clock signal CB' with a low level is transmitted to the fourth control electrode node N4' through the turned on sixth and seventh control electrode transistors M6 and M7, so that the level of the fourth control electrode node N4' is changed to a low level, so the ninth control electrode transistor M9 is turned on. The turned on ninth control electrode transistor M9 outputs the high level signal VGH, so the control electrode output signal EMOUT is still at a high level.

In a fifth phase P5, the first control electrode clock signal CK' is at a low level, so the first control electrode transistor M1 and the third control electrode transistor M3 are turned on. Since the second control electrode clock signal CB' is at a high level, the fourth control electrode transistor M4 and the seventh control electrode transistor M7 are turned off. The turned on first control electrode transistor M1 transmits the start signal ESTV with a low level to the first control electrode node N1', so that the level of the first control electrode node N1' is changed to a low level, so the second control electrode transistor M2, the eighth control electrode transistor M8, and the tenth control electrode transistor M10 are turned on. The turned on second control electrode transistor M2 transmits the first control electrode clock signal CK' with a low level to the second control electrode node N2', so that the level of the second control electrode node N2' may be further pulled down, so the second control electrode node N2' continues to maintain the low level of the previous phase, thereby turning on the fifth control electrode transistor M5 and the sixth control electrode transistor M6. In addition, the turned on eighth control electrode transistor M8 transmits the high level signal VGH to the fourth control electrode node N4', so that the level of the fourth control electrode node N4' is changed to a high level, so the ninth control electrode transistor M9 is turned off. The turn on tenth control electrode transistor M10 outputs the low level signal VGL, so the control electrode output signal EMOUT is changed to a low level.

In some embodiments, the multiplexing signal lines 62 includes a plurality of multiplexing control lines 621 and a plurality of multiplexing data lines 622.

At least one multiplexing unit 2 includes a plurality of multiplexing transistors 21. Each multiplexing transistor 21 has a gate connected with a multiplexing control line 621, a first electrode connected with a data line 11, and a second electrode connected with a multiplexing data line 622.

Second electrodes of all multiplexing transistors 21 of the same multiplexing unit 2 are connected with the same multiplexing data line 622, and second electrodes of the multiplexing transistors 21 of different multiplexing units 2 are connected with different multiplexing data lines 622.

Figure 6:
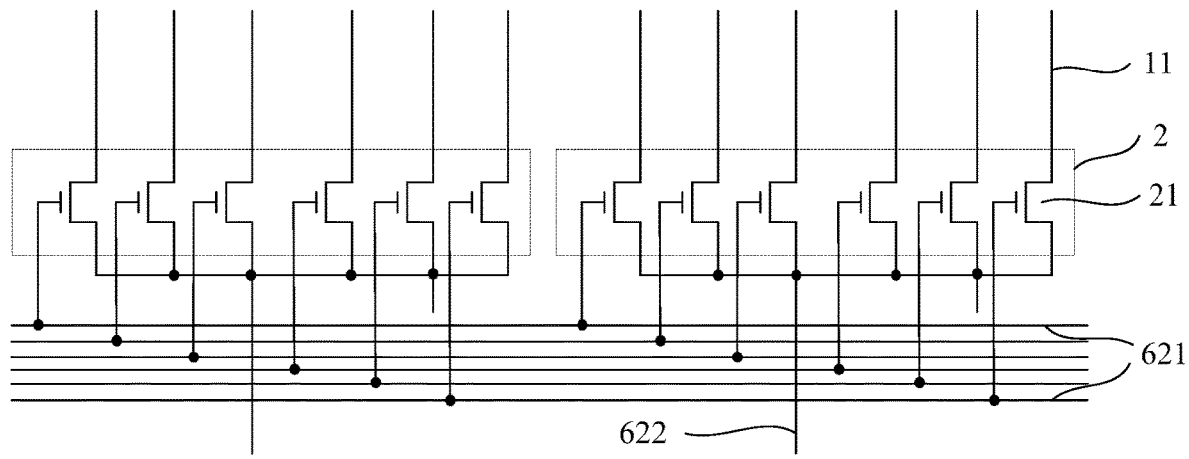
FIG. 6 is a schematic diagram of a circuit of a multiplexing unit in a display substrate according to an embodiment of the present disclosure.

Referring to FIG. 1, FIG. 2, FIG. 4, FIG. 5 and FIG. 6, the multiplexing signal line 62 includes the multiplexing control lines 621 and the multiplexing data lines 622, each multiplexing unit 2 includes a plurality of multiplexing transistors 21 (six multiplexing transistors in FIG. 6 as an example). Each multiplexing transistor 21 has a gate connected with the multiplexing control line 621, a first electrode connected with the data line 11, and a second electrode connected with the multiplexing data line 622. Furthermore, the same multiplexing unit 2 is connected with the same multiplexing data line 622, and different multiplexing units 2 are connected with different multiplexing data lines 622.

In this way, referring to FIG. 6, when it is to be displayed, turn-on signals (signals that can turn on transistors) may be input to the plurality of multiplexing control lines 621 in turn, and turn-off signals (signals that can turn off transistors) may be input to other multiplexing control lines 621, so that one multiplexing data line 622 may be connected with multiple different data lines 11 in turn through a plurality of multiplexing transistors 21 in one multiplexing unit 2, thereby providing required data signals to the plurality of data lines 11 through one multiplexed data line 622. That is, control for the plurality of data lines 11 through one signal source (e.g., a joint 6) may be achieved (that is, "one-to-many" may be achieved, e.g., one-to-six), so that the quantity of signal sources providing signals to the data lines 11 is much smaller than that of the data lines 11, thus simplifying the product structure, for example, reducing the quantity of required driving chips.

From the viewpoint of simplifying the structure, the quantity of multiplexing control lines 621 may be equal to the quantity of multiplexing transistors 21 in each multiplexing unit 2 (for example, six), that is, each multiplexing transistor 21 in each multiplexing unit 2 may be connected with different multiplexing control lines 621, and each multiplexing control line 621 is connected with one multiplexing transistor 21 in each multiplexing unit 2.

Since the multiplexing control line 621 needs to be connected with a plurality of multiplexing units 2, the multiplexing control line 621 may have a portion extending along the circumferential direction of the fan-out region 93, and different multiplexing units 2 are connected with different positions of the portion. However, each multiplexing data line 622 is only connected with one multiplexing unit 2, so each multiplexing data line 622 can be directly connected with the corresponding multiplexing unit 2 from the fan-out region 93.

Obviously, according to the above structure, the farther away from a connection sub-region 923 in the circumferential direction in the fan-out region 93 is, the smaller the quantity of the multiplexed data lines 621 is, and thus the smaller the size of the fan-out region 93 is.

In some embodiments, the test signal line 63 includes a test control line 631 and a test data line 632.

At least one test unit 3 includes a plurality of test transistors 31. Each test transistor 31 has a gate connected with a test control line 631, a first electrode connected with a data line 11, and a second electrode connected with a test data line 632.

Each test data line 632 is connected with a plurality of test units 3.

Referring to FIG. 1, FIG. 2, FIG. 4, FIG. 5, FIG. 7 and FIG. 8, the test signal line 63 includes a test control line 631 and a test data line 632. Accordingly, each test unit 3 may include a plurality of test transistors 31, each of which has a gate connected with the test control line 631, a first electrode connected with the data line 11, and a second electrode connected with the test data line 632. Therefore, by inputting a turn-on signal to the test control line 631, a signal in the test signal line 63 may be input to a plurality of corresponding data lines 11 through the test transistors 31 in different test units, so as to achieve the detection of the display apparatus.

Among them, since each test data line 632 is connected with a plurality of test units 3, the quantity of test data lines 632 is far smaller than the quantity of multiplexed data lines 621. Therefore, although the test units 3 are located far away from a joint region 94, since the test units 3 may be controlled only by a few test signal lines 63 extending to the test units 3, these few test signal lines 63 will not occupy a large layout area.

Among them, a corresponding relationship between the test data line 632, the test control line 631 and the test unit 3 may be various.

Figure 7:
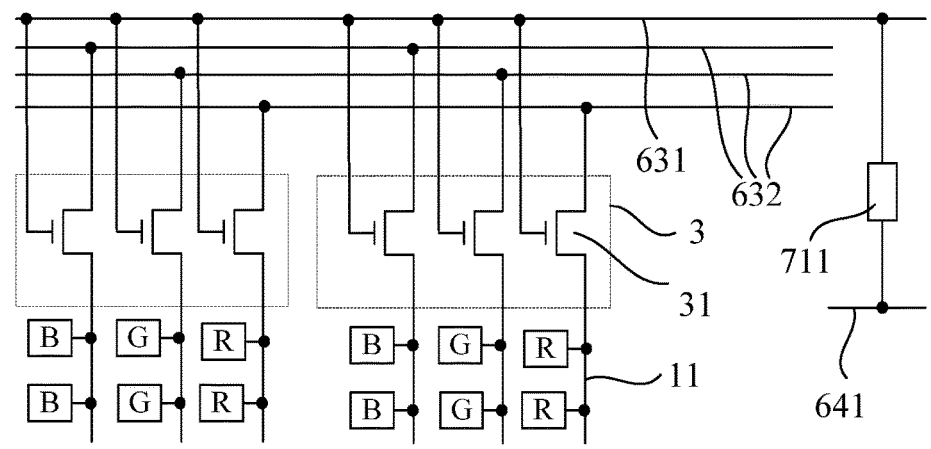
FIG. 7 is a schematic diagram of a circuit of a test unit in a display substrate according to an embodiment of the present disclosure.

For example, referring to FIG. 7, the quantity of test data lines 632 may be equal to the quantity of test transistors 31 in each test unit 3 (for example, three), and there is only one test control line 631, that is, each test data line 632 is connected with a second electrode of one test transistor 31 in each test unit 3. However, the first electrodes of different test transistors 31 are connected with different data lines 11, and the gates of all test transistors 31 in all test units 3 are all connected with this test control line 631.

In this case, referring to FIG. 7, the color of sub-pixels 1 connected with each data line 11 may be the same (in the drawings, a red sub-pixel 1 is represented by R, a green sub-pixel 1 is represented by G, and a blue sub-pixel 1 is represented by B), and the color of sub-pixels 1 connected with data lines 11 corresponding to each test data line 632 is the same, so that sub-pixels 1 of the same color can display the same brightness (e.g., white picture or other monochrome picture as a whole) by continuously inputting the same test signal to the test data lines 632, so as to locate defective sub-pixels 1.

For another example, the color of the sub-pixels 1 connected with each data line 11 is different. For example, referring to FIG. 8, two columns of sub-pixels 1 are green in every four columns of sub-pixels, and red and blue sub-pixels 1 are alternately arranged in each of the remaining two columns of sub-pixels 1, and two sub-pixels 1 in any same row are blue and red respectively, in these two columns of sub-pixels 1.

Figure 8:
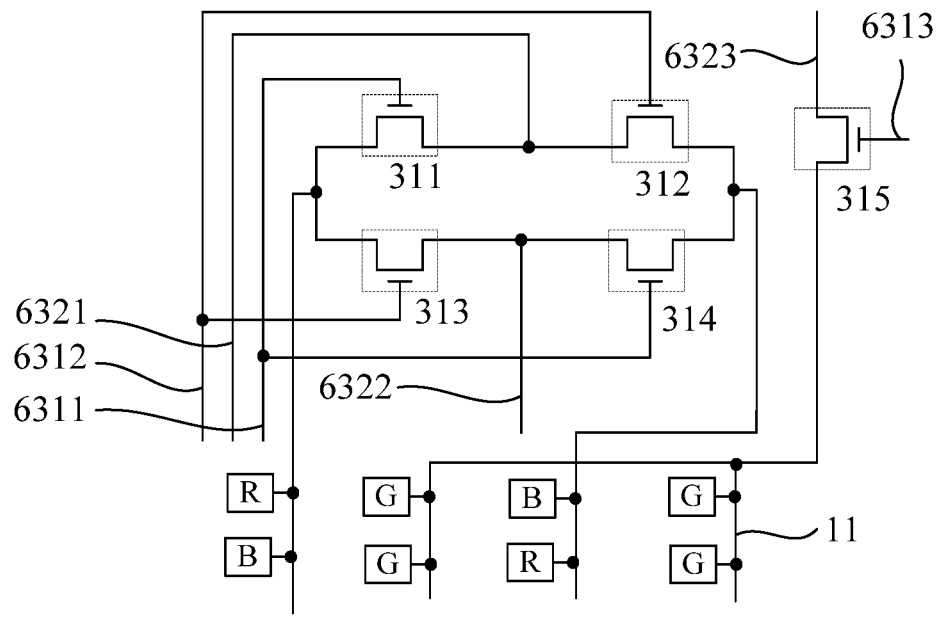
FIG. 8 is a schematic diagram of a circuit of another test unit in a display substrate according to an embodiment of the present disclosure.

Further, referring to FIG. 8, there are three test data lines 632 and three test control lines 631, and each test unit 3 may include five test transistors 31 for controlling four data lines 11 (corresponding to the above four columns of sub-pixels 1). First electrodes of a first test transistor 311 and a third test transistor 313 of each test unit 3 are connected with one column of sub-pixels 1 in which red and blue arranged in a mixed manner, first electrodes of a second test transistor 312 and a fourth test transistor 314 are connected with another column of sub-pixels 1 in which red and blue arranged in a mixed manner, and second electrodes of the first test transistors 311 and the second test transistor 312 are connected with a first test data line 6321. Second electrodes of the third test transistors 313 and the fourth test transistor 314 are connected with a second test data line 6322, gates of the first test transistor 311 and the fourth test transistors 314 are connected with a first test control line 6311, and gates of the second test transistors 312 and the third test transistors 313 are connected with a second test control line 6312. A fifth test transistor 315 has a gate connected with a third test control line 6313, a first electrode connected with two columns of green sub-pixels 1, and a second electrode connected with a third test data line 6323.

It may be seen from the above settings that the first test data line 6321 and the second test data line 6322 can control blue and green sub-pixels 1 respectively, while the third test control line 6313 and the third test data line 6323 control all green sub-pixels 1, by providing turn-on signals to the first test control line 6311 and the second test control line 6312 in turn, so as to achieve that sub-pixels 1 of the same color display the same brightness.

In some embodiments, the test signal line 63 is located on a side of the circuit region 92 away from the display region 91. The driving signal line 64 is located on a side of the circuit region 92 away from the display region 91.

Referring to FIG. 1, FIG. 2, FIG. 4, FIG. 5, and FIG. 13, both the test signal line 63 and the driving signal line 64 can be arranged along the side (outside) of the circuit region 92 away from the display region 91 for convenience of connection with the corresponding units. Of course, since the fan-out region 93 is also located outside the circuit region 92, some of the test signal line 63 and the driving signal line 64 are also located in the fan-out region 93.

Among them, the specific quantity of the test signal lines 63 and the driving signal lines 64 may be set according to the different forms of their corresponding units.

For example, when the test unit 3 is in a form of referring to FIG. 7, the test signal lines 63 may include three test data lines 632 and one test control line 631, that is, a total of four test signal lines 63 are arranged around the circuit region 92.

Figure 9:
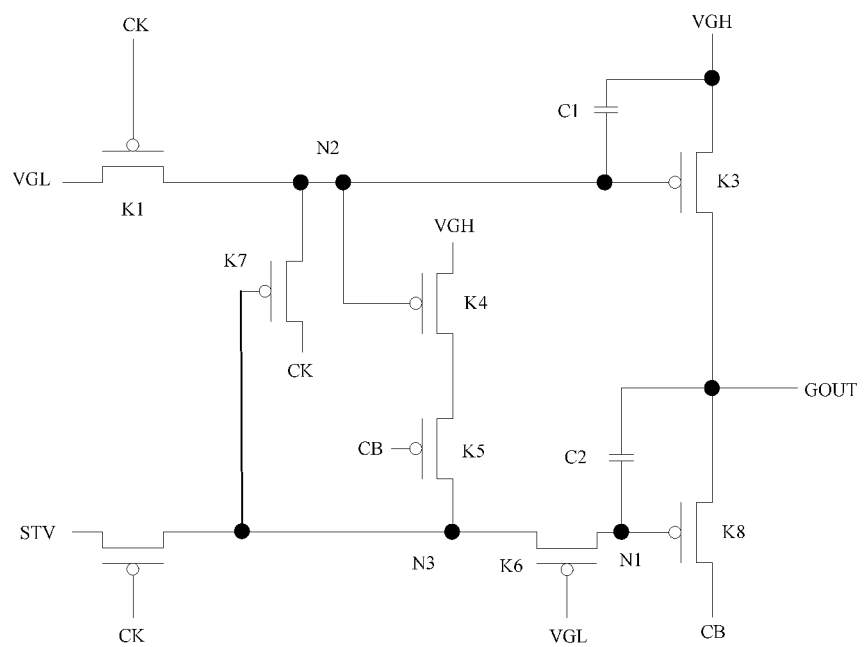
FIG. 9 is a circuit diagram of a gate shift register in a display substrate according to an embodiment of the present disclosure.
Figure 10:
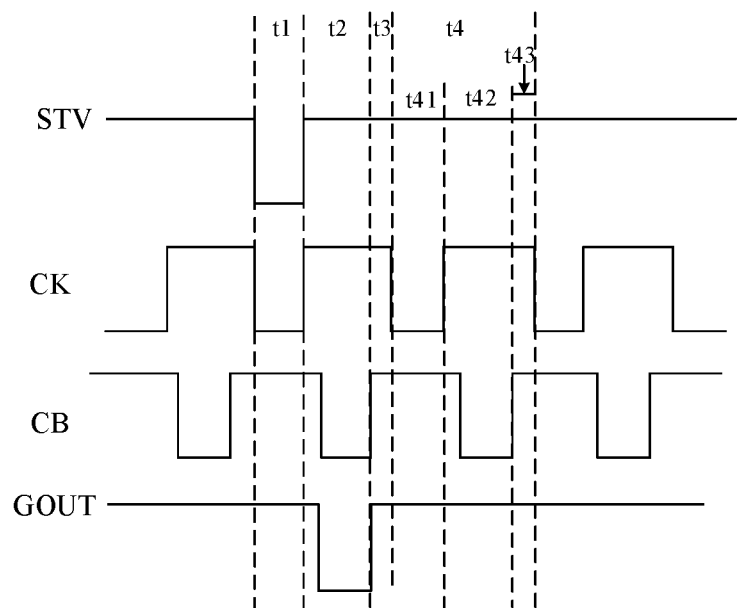
FIG. 10 is a driving timing diagram of a gate shift register in a display substrate according to an embodiment of the present disclosure.

For another example, when the gate driving unit 41 is in a form shown in FIG. 9, there may be four corresponding driving signal lines 64 for transmitting a first gate clock signal CK, a second gate clock signal CB, a high level signal VGH and a low level signal VGL, respectively.

Figure 11:
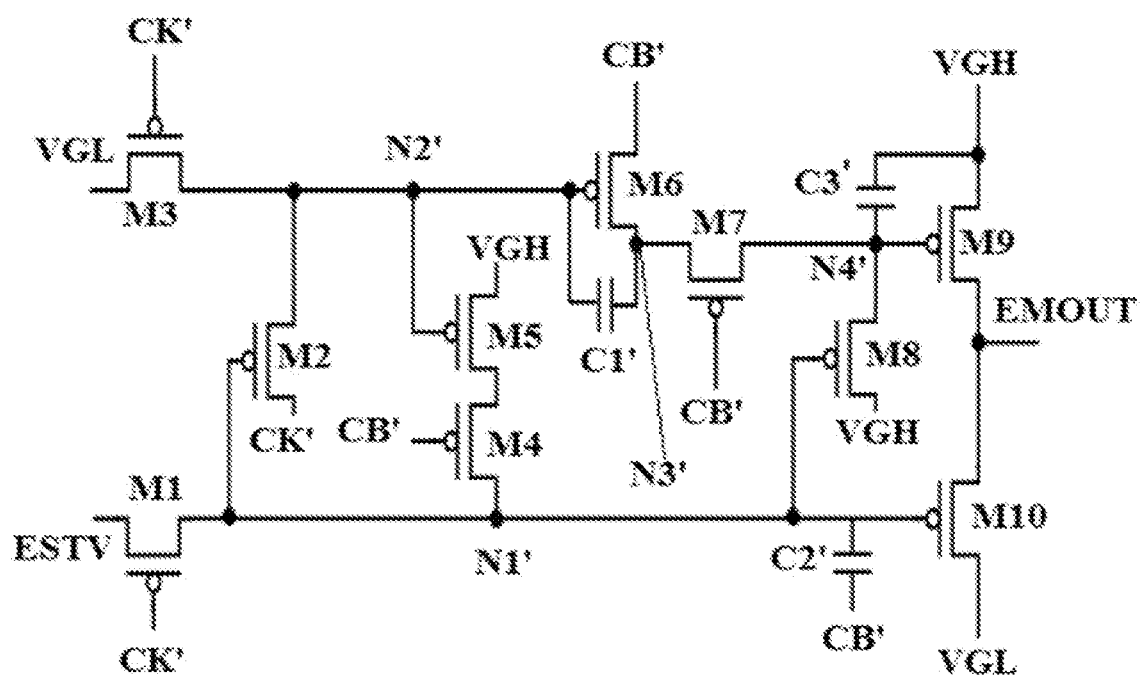
FIG. 11 is a circuit diagram of a control electrode shift register in a display substrate according to an embodiment of the present disclosure.
Figure 12:
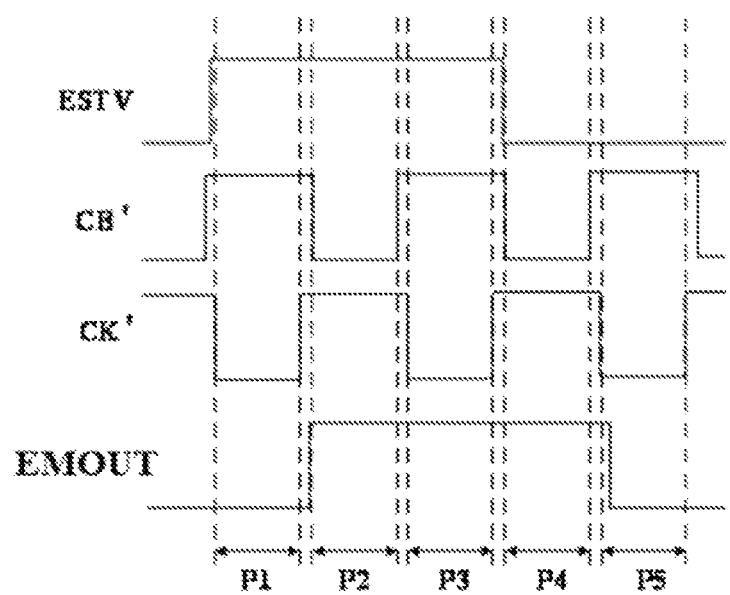
FIG. 12 is a driving timing diagram of a control electrode shift register in a display substrate according to an embodiment of the present disclosure.

For another example, when the control electrode driving unit 42 is in a form shown in FIG. 11, there may be four corresponding driving signal lines 64 for transmitting a first control electrode clock signal CK', a second control electrode clock signal CB', a high level signal VGH and a low level signal VGL.

Among them, since the first gate clock signal CK, the second gate clock signal CB, the first control electrode clock signal CK' and the second control electrode clock signal CB' are different from each other, they can correspond to four different driving signal lines 64. Since the high level signals VGH and low level signals VGL in the gate driving unit 41 and the control electrode driving unit 42 can be the same respectively, all the high level signals VGH can be transmitted through one driving signal line 64 (for example a high level line 641), while all the low level signals VGL can be transmitted through one driving signal line 64 (for example a low level line 642). Of course, both the high level line 641 and the low level line 642 at this time should be distributed outside a first half region and a second half region of the circuit region 92.

For example, referring to FIG. 1, FIG. 2, FIG. 4, FIG. 5, and FIG. 13, the above test signal line 63 may be located at a side (outside) of the driving signal line 64 away from the display region 91.

In some embodiments, an end of the first sub-region 921 closest to the second sub-region 922 is closer to the display region 91 than an end of the second sub-region 922 closest to the first sub-region 921.

Figure 13:
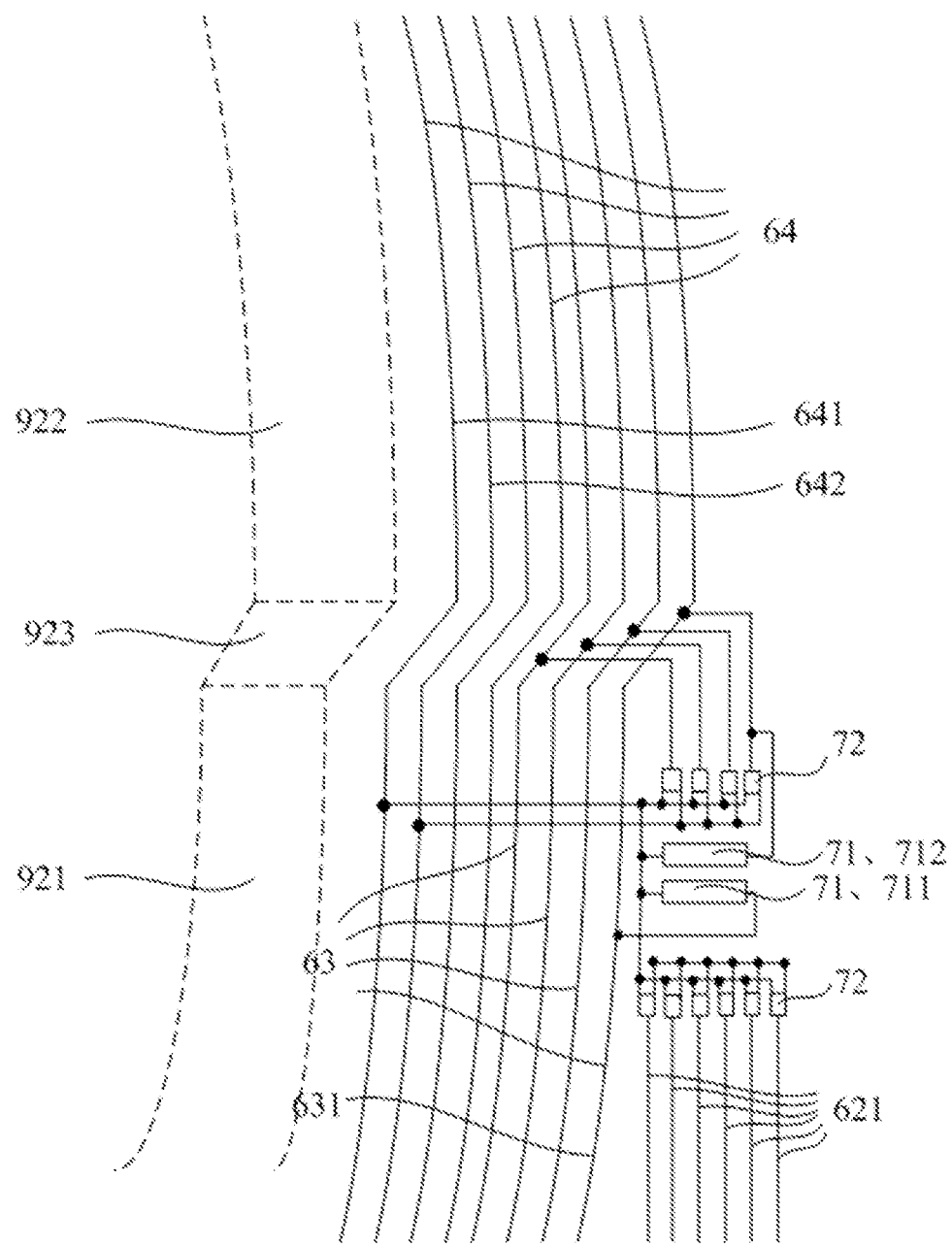
FIG. 13 is a partial schematic diagram of a structure of a connection sub-region in a display substrate according to an embodiment of the present disclosure.

Referring to FIG. 1, FIG. 2 and FIG. 13, since an inside of the first sub-region 921 is provided with a capacitor region 95 and an inside of the second sub-region 922 is a display region 91, the first sub-region 921 may be "closer to inside" than the second sub-region 922. Therefore, the first sub-region 921 is also "closer to inside" than the second sub-region 922 at the adjacent ends of the two sub-regions. For example, a radius of the first half circular annulus may be smaller than that of the second half circular annulus.

Of course, when the first sub-region 921 and the second sub-region 922 do not include the above "circular arc region" but have other shapes, they may not have a "radius", but their ends can still conform to the above positional relationship, that is, the first sub-region 921 can still be "smaller" than the second sub-region 922.

In some embodiments, the circuit region 92 further includes a connection sub-region 923 located between the first sub-region 921 and the second sub-region 922, and the connection sub-region is configured to electrically connect the first sub-region 921 and the second sub-region 922.

In some embodiments, the connection sub-region 923 is connected between an end of the first sub-region 921 closest to the second sub-region 922 and an end of the second sub-region 922 closest to the first sub-region 921.

Referring to FIG. 13, the end of the first sub-region 921 is "closer to inside" than the end of the second sub-region 922, so the two ends are "misaligned" and may need to be connected through an inclined connection sub-region 923.

It should be understood that the connection sub-region 923 also belongs to the circuit region 92, in the connection sub-region 923 the driving unit 4 may be disposed (but since the connection sub-region 923 is not the first sub-region 921 and the second sub-region 922, there is no multiplexing unit 2 and test power supply), but from the perspective of structural regularity, the structure in the connection sub-region 923 should be as simple as possible, for example, only necessary leads (for example leads for cascade connection between different driving units 4) are present.

At the same time, accordingly, for the sake of structural regularity, the test signal lines 63 and driving signal lines 64 located outside the circuit region 92 may be bent at a corresponding connection sub-region 923 to ensure that the distance between each test signal line 63 and each driving signal line 64 and the circuit region 92 is basically unchanged.

In some embodiments, the circuit region also includes a signal line protection unit, which is located on a side of the connection sub-region 923 away from the display region 91 and is electrically connected with the signal lines of the circuit region 92 and is configured to protect the signal lines of the circuit region 92.

In some embodiments, the signal line protection unit of the embodiment of the present disclosure includes at least one polysilicon resistor 71, each of which is connected between two signal lines. The polysilicon resistor 71 is located at a side of the first sub-region 921 closest to an end of the second sub-region 922 and away from the display region 91, or at a side of the connecting sub-region 923 away from the display region 91.

The polysilicon resistor 71, also called "poly resistor", is a resistor made of polysilicon (p-Si) material with large resistance. The polysilicon resistor 71 is connected between different signal lines, so that when one of the signal lines has no signal, a signal in the other signal line can enter this signal line to a certain extent after being delayed, thereby avoiding the signal fluctuation caused by floating of the signal line. Meanwhile, when there are signals in both signal lines, since the resistance of the polysilicon resistor 71 is very large, the two signal lines will not be shorted, and the signals in the two signal lines will not affect each other.

Among them, in order to achieve as large a resistance as possible in as small a layout area as possible, the polysilicon resistor 71 may has a structure in which a linear polysilicon material is bent in a small region.

As before, the end of the first sub-region 921 is "closer to inside" than the end of the second sub-region 922, so the end of the first sub-region 921 and the outer side of the connecting sub-region 923 will have a certain space relatively. Therefore, referring to FIG. 1, FIG. 2 and FIG. 13, the polysilicon resistors 71 may be placed at this position. For example, polysilicon resistors 71 may be disposed at the ends of the first sub-region 921 and the outer side of the connecting sub-region 923 along two sides of the second direction 992 (the left and right sides in FIG. 1 and FIG. 2).

In some embodiments, the test signal line 63 is located at a side of the circuit region 92 away from the display region 91.

The driving signal line 64 is located at a side of the circuit region 92 away from the display region 91.

The polysilicon resistors 71 are located at sides of the test signal line 63 and the driving signal line 64 away from the display region 91.

Referring to FIG. 1, FIG. 2 and FIG. 13, when the test signal line 63 and the driving signal line 64 are also located outside the circuit region 92, the polysilicon resistors 71 may be disposed outside these signal lines to avoid the polysilicon resistor 71 from affecting the connection between these signal lines and the corresponding units in the circuit region 92.

In some embodiments, the driving signal line 64 includes a high level line 641 and a low level line 642, the test signal line 63 includes a test control line 631 and a test data line 632, and the multiplexing signal line 62 includes a multiplexing control line 621 and a multiplexing data line 622. At least one polysilicon resistor 71 is connected with the test control line 631 and the high level line 641, and at least one polysilicon resistor 71 is connected with the test control line 631 and the multiplexing control line 621.

In some embodiments, the signal line protection unit of the embodiment of the present disclosure further includes at least one electrostatic discharge unit 72. Each electrostatic discharge unit 72 is connected with a signal line and configured to discharge static electricity in the signal line connected with it. The electrostatic discharge unit 72 is located at a side of the first sub-region 921 closest to the end of second sub-region 922 and away from the display region 91, or at a side of the connection sub-region 923 away from the display region 91.

In order to prevent damage caused by discharge breakdown due to static electricity accumulation in the signal line, an electrostatic discharge unit 72 (ESD) may also be disposed to discharge static electricity accumulated in the signal line and protect the signal line.

As before, the end of the first sub-region 921 is "closer to inside" than the end of the second sub-region 922, so the end of the first sub-region 921 and the outer side of the connection sub-region 923 will have a certain space relatively. Therefore, referring to FIG. 1, FIG. 2 and FIG. 13, the electrostatic discharge unit 72 can be disposed at this position. For example, the electrostatic discharge units 72 may be disposed at the end of the first sub-region 921 and the outer side of the connecting sub-region 923 along two sides of the second direction 992 (the left and right sides in FIG. 1 and FIG. 2).

Among them, the positions occupied by the polysilicon resistor 71 and the electrostatic discharge unit 72 should not exceed a position difference between the end of the first sub-region 921 and the end of the second sub-region 922, for example, their sizes may be between 100 and 150. m.

Of course, Even if a size of the first sub-region 921 is not smaller than a size of the second sub-region 922 (for example, the sub region includes U-shaped annulus region), referring to FIG. 4, the polysilicon resistors 71 and the electrostatic discharge unit 72 may be disposed outside a junction between the first sub-region 921 and the second sub-region 922.

Among them, it should be understood that the polysilicon resistors 71 (e.g., a first polysilicon resistor 711 and a second polysilicon resistor 712) shown in respective circuit diagrams (e.g., FIG. 7 and FIG. 16) of the embodiments of the present disclosure only represent an electrical connection structure of the polysilicon resistors 71, but do not represent a physical position relationship between the polysilicon resistors 71 and other units.

In some embodiments, the test signal line 63 is located at a side of the circuit region 92 away from the display region 91.

The driving signal line 64 is located at a side of the circuit region 92 away from the display region 91.

The electrostatic discharge unit 72 is located at a side of the test signal line 63 and the driving signal line 64 away from the display region 91.

Referring to FIG. 1, FIG. 2, FIG. 4, FIG. 5 and FIG. 13, when the test signal line 63 and the driving signal line 64 are located outside the circuit region 92, the static discharge unit 72 can be disposed outside these signal lines to avoid the static discharge unit 72 from affecting the connection between these signal lines and corresponding units in the circuit region 92.

In some embodiments, the multiplexing signal line 62 includes a plurality of multiplexing control lines 621 and a plurality of multiplexing data lines 622. A signal line connected with each electrostatic discharge unit 72 is a test signal line 63 or a multiplexing control line 621.

Referring to FIG. 13, there may be a plurality of static discharge units 72, which are respectively connected with the above test signal lines 63 (e.g., four test signal lines 63) and multiplex control lines 621 (e.g., six multiplex control lines 621) and protect them.

In some embodiments, the driving signal line 64 includes a high level line 641 configured to be connected with a high level signal source and a low level line 642 configured to be connected a low level signal source.

Each electrostatic discharge unit 72 includes a first discharge transistor 721 and a second discharge transistor 722. The first discharge transistor 721 has a gate and a first electrode connected with the high level line 641, and a second electrode connected with a signal line (the test signal line 63 or the multiplex control line 621) corresponding to the electrostatic discharge unit 72. The second discharge transistor 722 has a gate and a first electrode connected with a signal line corresponding to the electrostatic discharge unit 72, and a second electrode connected with the low level line 642.

Figure 16:
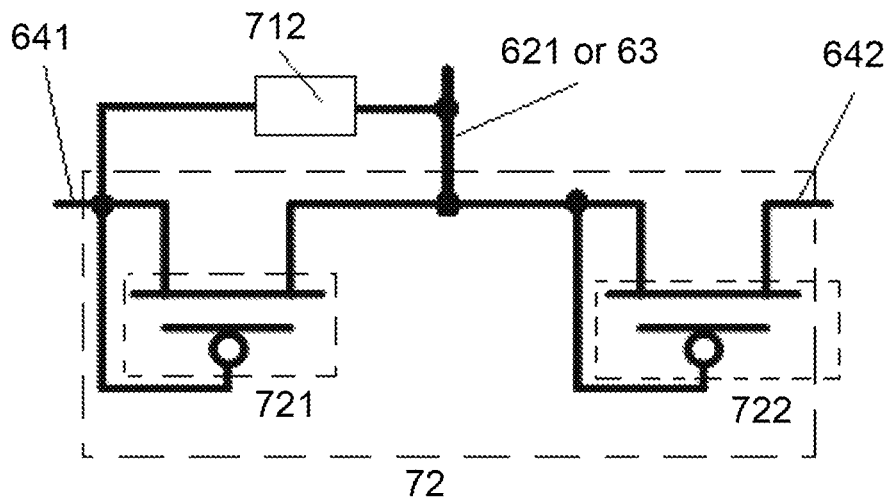
FIG. 16 is a schematic diagram of a circuit of an electrostatic discharge unit in a display substrate according to an embodiment of the present disclosure.

Referring to FIG. 13 and FIG. 16, as one form of the embodiment of the present disclosure, the electrostatic discharge unit 72 may include two discharge transistors. One electrode of each discharge transistor is connected with its own gate, thereby forming an equivalent diode connection. A signal line to be protected is connected between the two diodes, and the other ends of the two diodes are respectively connected with the above high level line 641 (transmitting the high level signal VGH) and the low level line 642 (transmitting the low level signal VGL). Therefore, when an instantaneous high voltage (e.g., 100V) occurs in the signal line due to accumulated positive charges, the diode of the first release transistor 721 is turned on to discharge the positive charges in the signal line. On the other hand, when an instantaneous low voltage (e.g., −100V) occurs in the signal line due to accumulated negative charges, the diode of the second discharge transistor 722 is turned on to discharge the negative charges in the signal line.

In some embodiments, the polysilicon resistors 71 includes first polysilicon resistors 711, and two signal lines connected with each first polysilicon resistor 711 are the high level line 641 and the test control line 631.

Referring to FIG. 7 and FIG. 13, at least some of the polysilicon resistors 71 (the first polysilicon resistors 711) may be connected between the high level line 641 (transmitting the high level signal VGH) and the test control line 631 (transmitting the control signal of the test unit 3). When performing of a test (such as ET test), the test control line 631 obtains a turn-on signal or a turn-off signal as required, and the first polysilicon resistor 711 prevents it from being affected by the high level signal VGH. However, during normal display, there is no need for testing, so a fixed turn-off signal can be input to the test control line 631, and the first polysilicon resistor 711 ensures the stability of the level of the test control line 631.

In some embodiments, the polysilicon resistors 71 includes second polysilicon resistors 712, and the two signal lines connected with each second polysilicon resistor 712 are the high level line 641 and a signal line corresponding to the electrostatic discharge unit 72 respectively.

Referring to FIG. 13 and FIG. 16, at least some of the polysilicon resistors 71 (the second polysilicon resistors 712) may be connected between the high level line 641 (transmitting the high level signal VGH) and a signal line (the test signal line 63 or the multiplexing control line 621) corresponding to the electrostatic discharge unit 72, so as to prevent occurrence of an excessively high level.

Of course, it should be understood that since the signal lines corresponding to different electrostatic discharge units 72 are different, different electrostatic discharge units 72 should be connected with different second polysilicon resistors 712, that is, the quantity of second polysilicon resistors 712 can be the same as the quantity of electrostatic discharge units 72. However, in FIG. 13, in order to clearly show the connection relationship, only some of the second polysilicon resistors 712 are shown.

In some embodiments, the quantity of sub-pixels 1 connected with at least some different data lines 11 is different.

Except for a data line 11 connected with the largest quantity of sub-pixels 1, each other data line 11 is connected with a compensation capacitor unit 5.

Referring to FIG. 1 and FIG. 2, in some cases, the quantity of sub-pixels 1 connected with different data lines 11 is different. For example, when the display region 91 is basically circular, and each data line 11 is connected with a column of sub-pixels 1, the quantity of sub-pixels 1 connected with different data lines 11 is different because the quantity of sub-pixels 1 in different columns is different.

Obviously, each sub-pixel 1 has a certain capacitance (pixel capacitance) as a whole, and this capacitance is equivalent to a "load" of the data line 11 connected with it. Therefore, different quantities of sub-pixels 1 connected with the data lines 11 are equivalent to different loads of the data lines 11, which causes sub-pixels 1 connected with different data lines 11 to actually obtain different signals when the same signal is applied to the data lines 11, thereby affecting display.

Therefore, except for a data line 11 connected with the largest quantity of sub-pixels 1 (i.e., the data lines 11 with the largest load), other data lines 11 may be connected with the compensation capacitor unit 5, which is used to "add (or compensate)" a certain load to (for) the data lines 11, so that the total loads (total capacitances) of all the data lines 11 are as close as possible and the display effect is uniform.

In some embodiments, each compensation capacitor unit 5 includes one or more compensation capacitors 51.

Except for a data line 11 connected with the largest quantity of sub-pixels 1, the quantity n of compensation capacitors 51 of the compensation capacitor unit 5 connected with other data lines 11 satisfies:

$$n = N\max - N;$$

Where Nmax is the quantity of sub-pixels 1 connected with the data line 11 which connected with the largest quantity of sub-pixels 1, and N is the quantity of sub-pixels 1 connected with the data line 11 connected with the compensation capacitor unit 5.

Figure 17:
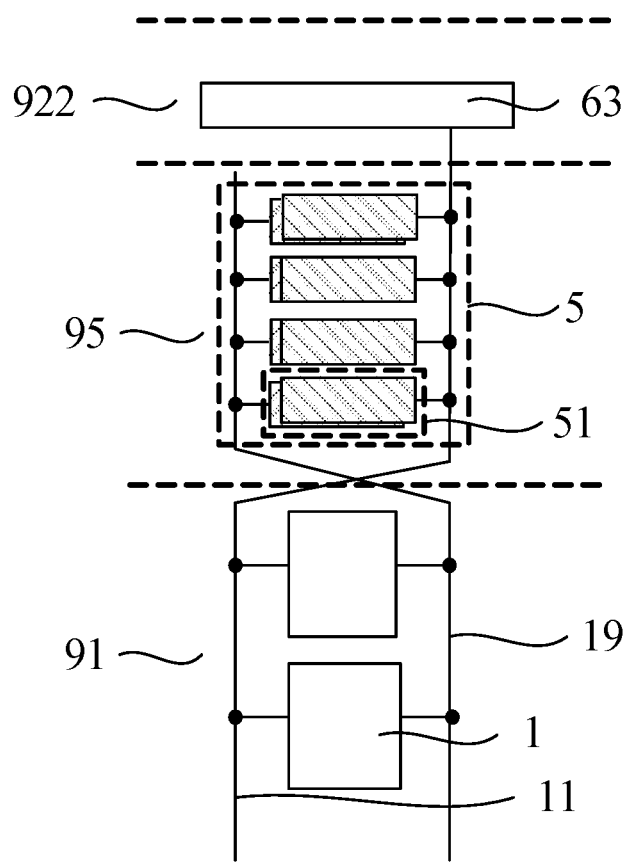
FIG. 17 is a schematic diagram of a partial structure of a compensation capacitor unit in a display substrate according to an embodiment of the present disclosure.

Referring to FIG. 17, each compensation capacitor unit 5 may include a plurality of compensation capacitors 51, and the quantity of compensation capacitors 51 is equal to the difference between the quantity (N) of sub-pixels 1 connected with a data line 11 corresponding to the compensation capacitor unit 5 and the quantity Nmax of sub-pixels 1 connected with the data line 11 corresponding to the largest quantity of sub-pixels. In this way, as long as the capacitance value of a single compensation capacitor 51 is basically equal to the capacitance value of a single sub-pixel 1, the total capacitance (total load) connected with all the data lines 11 after compensation may be basically the same.

Generally speaking, a plurality of actual sub-pixels 1 may be manufactured firstly, and an actual capacitance value of a single sub-pixel 1 may be detected, and then an actual size of the compensation capacitor 51 may be set according to the actual capacitance value. Specifically, in order to reduce the error, a total capacitance value of a plurality of (e.g., 10) sub-pixels 1 can usually be detected and divided by the quantity (e.g., 10) of sub-pixels 1 to obtain the capacitance value of the single sub-pixel 1 (usually about 20 to 30 fF).

In some embodiments, the data line 11 is connected with first electrodes of all compensation capacitors 51 of a compensation capacitor unit 5 connected with it.

Second electrodes of the compensation capacitors 51 are all connected with the same constant level signal line.

Referring to FIG. 17, the data line 11 can be specifically connected with one electrode of each compensation capacitor 51 in a corresponding compensation capacitor unit 5, and other electrodes of all compensation capacitors 51 only need to be connected with a constant level signal line to obtain the same and fixed level. Exemplary, the other electrodes of all compensation capacitors 51 may be connected with an anode signal line 19 for supplying power to an anode signal terminal VDD of a pixel circuit.

In some embodiments, a plurality of sub-pixels 1 connected with each data line 11 are arranged in a column along the first direction 991.

The compensation capacitor unit 5 connected with each data line 11 is disposed along the first direction 991 between a column of sub-pixels 1 connected with the data line 11 and the second sub-region 922.

Referring to FIG. 17, when sub-pixels 1 are arranged in a plurality of columns and each data line 11 is connected with one column of sub-pixels 1, the shorter the column is, the smaller the quantity of sub-pixels 1 is, so the larger the quantity of compensation capacitors 51 in the corresponding compensation capacitor unit 5 is, the larger the area occupied by the compensation capacitor unit 5 is. Therefore, from the perspective of making full use of space, the compensation capacitor unit 5 may be disposed between a column of sub-pixels 1 corresponding to it and the second sub-region 922.

Of course, the connection relationship, specific form, setting position, etc. of the compensation capacitor unit 5 described above are not limiting the protection scope of the embodiment of the present disclosure.

In a second aspect, an embodiment of the present disclosure provides a display apparatus including any of the above display substrates.

The above display substrate can be combined with other devices (e.g., a cover plate for cell-assembling, a flexible circuit board, a driving chip, a power supply assembly, etc.) to form a display apparatus with display function.

In some embodiments, the display apparatus is a wearable display apparatus.

Specifically, the above display apparatus is particularly suitable for a wearable display apparatus that may be worn on a human body, for example, the display apparatus may be a smart watch worn on a wrist of a person.

Of course, the wearable display apparatus may include devices worn on the human body, such as a watchband.

The above display apparatus is not limited to the wearable display apparatus, and may alternatively be any product or component with a display function such as electronic paper, a mobile phone, a tablet computer, a TV set, a display, a notebook computer, a digital photo frame, a navigator.

Example embodiments have been disclosed in the present disclosure, and although specific terms are employed, they are only used and should only be interpreted in a general illustrative sense, and are not used for the purpose of limitation. In some examples, it is obvious to those skilled in the art that the features, characteristics and/or elements described in connection with specific embodiments may be used alone or in combination with those described in connection with other embodiments, unless explicitly stated otherwise. Therefore, it will be understood by those skilled in the art that various changes in form and details may be made without departing from the scope of the present disclosure as set forth in the appended claims.

What is claimed is:

1. A display substrate, comprising:
a display region and a peripheral region, wherein the peripheral region comprises a circuit region, and the display region comprises a plurality of sub-pixels, a plurality of data lines extending along a first direction and a plurality of gate lines extending along a second direction crossing the first direction, each of the data lines is connected with the plurality of sub-pixels and each of the gate lines is connected with the plurality of sub-pixels;

the circuit region comprises a first sub-region and a second sub-region that are opposite to each other at two sides of the display region along the first direction, the circuit region comprises a plurality of driving unit groups each comprising at least one driving unit, the first sub-region comprises a plurality of multiplexing unit groups each comprising at least one multiplexing unit, and the second sub-region comprises a plurality of test unit groups each comprising at least one test unit, the driving unit is configured to provide a driving signal to the gate lines, the multiplexing unit is configured to provide a data signal to the data lines, and the test unit is configured to provide a test signal to the data lines; and in the first sub-region, the driving unit groups and multiplexing unit groups are alternately disposed; and in the second sub-region, the driving unit groups and the test unit groups are alternately disposed, wherein the circuit region further comprises a connection sub-region located between the first sub-region and the second sub-region, and the connection sub-region is configured to electrically connect the first sub-region and the second sub-region; and the circuit region also comprises a signal line protection unit which is located at a side of the connection sub-region away from the display region and is electrically connected with signal lines of the circuit region.

2. The display substrate according to claim 1, wherein the signal line protection unit comprises at least one polysilicon resistor, and the circuit region further comprises a plurality of the signal lines, and each of the at least one polysilicon resistor is connected between at least two of the signal lines.

3. The display substrate according to claim 2, wherein the signal lines comprise test signal lines connected with the test unit and driving signal lines connected with the driving unit, wherein the driving signal lines comprise a high level line and a low level line, and the test signal lines comprise a test control line and a test data line, and the at least one polysilicon resistor connects the test control line and the high level line.

4. The display substrate according to claim 2, wherein the signal lines comprise a multiplexing signal line connected with the multiplexing unit and test signal lines connected with the test unit, wherein the test signal lines comprise a test control line and a test data line, and the at least one polysilicon resistor connects the test control line and the multiplexing control lines.

5. The display substrate according to claim 1, wherein the signal line protection unit comprises at least one electrostatic discharge unit, and the signal lines comprise multiplexing signal lines connected with the multiplexing unit, test signal lines connected with the test unit and driving signal lines connected with the driving unit, and each of the at least one electrostatic discharge unit is connected with one of the signal lines.

6. The display substrate according to claim 5, wherein the driving signal lines comprise a high level line and a low level line, the test signal lines comprise a test control line and a test data line, and the multiplexing signal lines comprise a multiplexing control line and a multiplexing data line, and the at least one electrostatic discharge unit is connected with the test control line, or the at least one electrostatic discharge unit is connected with the test data line, or the at least one electrostatic discharge unit is connected with the multiplexing control line.

7. The display substrate according to claim 1, wherein in the first sub-region, a quantity C of multiplexing units comprised in the multiplexing unit groups between two adjacent driving unit groups and a gap size D between the two adjacent driving unit groups satisfy a following relationship:

$$D=a*C+(C+1)*d1;$$

wherein, a is a size of each multiplexing unit along an arrangement direction of the multiplexing units and d1 is a gap size between the adjacent multiplexing units; and/or, in the second sub-region, a quantity E of test units comprised in the test unit groups between two adjacent driving unit groups and a gap size F between two adjacent driving unit groups satisfy a following relationship:

$$F=b*E+(E+1)*d2;$$

wherein b is a size of each test unit along an arrangement direction of the test unit, and d2 is a gap size between the adjacent test units.

8. The display substrate according to claim 7, wherein d1 is 1 to 5 microns and d2 is 1 to 5 microns.

9. The display substrate according to claim 1, wherein the first sub-region comprises a first circular arc region and the second sub-region comprises a second circular arc region;
in the first sub-region, the driving unit groups and multiplexing unit groups are alternately disposed, in the first circular arc region, the driving unit groups and multiplexing unit groups are alternately disposed along a side of the first circular arc region close to the display region; and
in the second sub-region, the driving unit groups and the test unit groups are alternately disposed, in the second circular arc region, the driving unit groups and the test unit groups are alternately disposed along a side of the second circular arc region close to the display region.

10. The display substrate according to claim 9, wherein in the first circular arc region, a connection track of center points of coverage regions of the plurality of driving unit groups is a first circular arc track, and a connection track of center points of coverage regions of the plurality of multiplexing unit groups is a second circular arc track, and a circle center corresponding to the first circular arc track, a circle center corresponding to the second circular arc track are substantially coincide with a circle center corresponding to an edge of the first circular arc region close to the display region; and/or
in the second circular arc region, a connection track of center points of coverage regions of the plurality of driving unit groups is a third circular arc track, and a connection track of center points of coverage regions of a plurality of test unit groups is a fourth circular arc track, and a circle center corresponding to the third circular arc track, a circle center corresponding to the fourth circular arc track are substantially coincide with a circle center corresponding to an edge of the second circular arc region close to the display region.

11. The display substrate according to claim 9, wherein the first circular arc region is a semi-circle shape, and the second circular arc region is a semi-circle shape.

12. The display substrate according to claim 9, wherein the first sub-region comprises a first U-shaped annulus region and the second sub-region comprises a second U-shaped annulus region, the first U-shaped annulus region comprises two sections of the first circular arc region and at least one section of a second rectangular region, and the second U-shaped annulus region comprises two sections of the second circular arc region and at least one section of a third rectangular region;
in the second rectangular region, a plurality of multiplexing units is disposed along a side of the second rectangular region close to the display region; and
in the third rectangular region, a plurality of test units is disposed along a side of the third rectangular region close to the display region.

13. The display substrate according to claim 12, wherein the circuit region further comprises a plurality of sections of first rectangular region, and the first rectangular region are disposed between the first circular arc region and the second circular arc region; and
in the first rectangular region, a plurality of driving units is disposed along a side of the first rectangular region close to the display region.

14. The display substrate according to claim 1, wherein,
in the first sub-region, the multiplexing unit groups comprise a first multiplexing unit group and a second multiplexing unit group, the first multiplexing unit group comprises M multiplexing units, and the second multiplexing unit group comprises N multiplexing units, where N and M are integers greater than 1 and M<N, the second multiplexing unit group is located in the middle of the first sub-region and the first multiplexing unit group is located at two ends of the first sub-region away from the middle of the first sub-region; and/or
in the second sub-region, the test unit groups comprise a first test unit group and a second test unit group, the first test unit group comprises K test units, and the second test unit group comprises L test units, where L and K are integers greater than 1, and K<L, the second test unit group is located in the middle of the second sub-region, and the first test unit group is located at two ends of the second sub-region away from the middle of the second sub-region.

15. The display substrate according to claim 1, wherein the peripheral region further comprises a joint region located at a side of the first sub-region away from the display region, the joint region comprises a plurality of joints, and at least some of the joints are connected with signal lines; the signal lines comprise multiplexing signal lines connected with the multiplexing unit, test signal lines connected with the test unit, and driving signal lines connected with the driving unit.

16. The display substrate according to claim 15, wherein the peripheral region further comprises a fan-out region disposed between the joint region and the first sub-region, and the fan-out region comprises a plurality of multiplexing signal lines.

17. The display substrate according to claim 15, wherein the multiplexing signal lines comprise a plurality of multiplexing control lines and a plurality of multiplexing data lines;
at least one of multiplexing units comprises a plurality of multiplexing transistors, each of which has a gate connected with one of the multiplexing control lines, a first electrode connected with one of the data lines, and a second electrode connected with one of the multiplexing data lines; and
second electrodes of all multiplexing transistors of a same multiplexing unit are connected with a same multiplexing data line, and second electrodes of multiplexing transistors of different multiplexing units are connected with different multiplexing data lines.

18. The display substrate according to claim 15, wherein the test signal lines comprise test control lines and test data lines;

at least one of test units comprises a plurality of test transistors, each of which has a gate connected with one of test control lines, a first electrode connected with one of the data lines, and a second electrode connected with one of the test data lines; and each of the test data lines is connected with a plurality of test units.

19. A display apparatus, comprising the display substrate of claim 1.

* * * * *